United States Patent
Canale et al.

(10) Patent No.: US 9,539,801 B2
(45) Date of Patent: Jan. 10, 2017

(54) DEBONDERS WITH A RECESS AND A SIDE WALL OPENING FOR SEMICONDUCTOR FABRICATION

(71) Applicant: Skyworks Solutions, Inc., Woburn, MA (US)

(72) Inventors: Steve Canale, Simi Valley, CA (US); David J. Zapp; Daniel Eduardo Sanchez, Camarillo, CA (US); Hung V. Phan, Simi Valley, CA (US); Hyong Yong Lee, Thousand Oaks, CA (US)

(73) Assignee: Skyworks Solutions, Inc., Woburn, MA (US)

(*) Notice: Subject to any disclaimer, the term of this patent is extended or adjusted under 35 U.S.C. 154(b) by 0 days.

(21) Appl. No.: 15/048,673

(22) Filed: Feb. 19, 2016

(65) Prior Publication Data
US 2016/0167360 A1    Jun. 16, 2016

Related U.S. Application Data

(60) Division of application No. 14/287,660, filed on May 27, 2014, now Pat. No. 9,296,194, which is a
(Continued)

(51) Int. Cl.
*B32B 38/10* (2006.01)
*B32B 43/00* (2006.01)
(Continued)

(52) U.S. Cl.
CPC ....... *B32B 43/006* (2013.01); *H01L 21/67005* (2013.01); *H01L 21/67092* (2013.01);
(Continued)

(58) Field of Classification Search
CPC ............ H01L 2221/68381; H01L 2221/68386; B32B 43/006; B32B 38/10; Y10T 156/1132; Y10T 156/1944
See application file for complete search history.

(56) References Cited

U.S. PATENT DOCUMENTS 5,067,695 A    11/1991    Huddleston
5,240,546 A    8/1993    Shiga
(Continued)

FOREIGN PATENT DOCUMENTS

EP    1286385    2/2003
JP    61-272927    12/1986
(Continued)

OTHER PUBLICATIONS http://sydor.com/products-micro-electronic-substrates.asp, Internet archive date of Jul. 2007.
(Continued)

*Primary Examiner* — Mark A Osele
(74) *Attorney, Agent, or Firm* — Knobbe, Martens, Olson & Bear, LLP

(57) ABSTRACT

A first surface of a debonder defines a recess that holds an assembly that includes a wafer bonded to a carrier plate having a first diameter that is larger than a second diameter of the wafer. The plate includes a peripheral area not covered by the wafer, and when the wafer of the assembly is placed within the recess, a portion of the peripheral area of the plate engages a portion of the first surface. A second surface of the debonder is disposed in the recess and is separated from the first surface. The second surface includes suction openings that deliver suction to the recess. A third surface of the debonder substantially connects the first and the second surfaces and includes an opening dimensioned to limit a pressure differential between the recess and outside the recess during application of the suction.

20 Claims, 29 Drawing Sheets

Related U.S. Application Data continuation of application No. 12/898,623, filed on Oct. 5, 2010, now Pat. No. 8,758,552.

(60) Provisional application No. 61/352,324, filed on Jun. 7, 2010.

(51) Int. Cl.
  *H01L 21/67* (2006.01)
  *H01L 21/683* (2006.01)

(52) U.S. Cl.
  CPC .... *H01L 21/67253* (2013.01); *H01L 21/6835* (2013.01); *H01L 21/6838* (2013.01); *H01L 2221/68381* (2013.01); *H01L 2221/68386* (2013.01); *Y10T 156/1132* (2015.01); *Y10T 156/1933* (2015.01); *Y10T 156/1944* (2015.01); *Y10T 156/1961* (2015.01); *Y10T 156/1978* (2015.01)

(56) References Cited

U.S. PATENT DOCUMENTS

| | | | |
|---|---|---|---|
| 5,432,318 A | 7/1995 | Minahan | |
| 5,564,682 A * | 10/1996 | Tsuji | B25B 11/005 269/21 |
| 5,800,665 A | 9/1998 | Okaniwa et al. | |
| 5,810,935 A | 9/1998 | Lee et al. | |
| 5,975,992 A | 11/1999 | Raeder et al. | |
| 6,029,730 A | 2/2000 | Gospe et al. | |
| 6,032,715 A | 3/2000 | Ohkubo et al. | |
| 6,068,727 A | 5/2000 | Weaver et al. | |
| 6,076,585 A | 6/2000 | Klingbeil, Jr. et al. | |
| 6,156,150 A | 12/2000 | Nishida | |
| 6,470,946 B2 | 10/2002 | De | |
| 6,998,329 B2 | 2/2006 | Aga et al. | |
| 7,070,178 B2 | 7/2006 | Van Der Toom | |
| 7,314,076 B2 | 1/2008 | Wardell et al. | |
| 7,607,647 B2 | 10/2009 | Zhao et al. | |
| 8,186,661 B2 | 5/2012 | Pitney et al. | |
| 8,336,188 B2 * | 12/2012 | Monteen | H01L 21/6838 269/21 |
| 8,758,552 B2 | 6/2014 | Canale et al. | |
| 8,758,553 B2 | 6/2014 | Riege et al. | |
| 8,888,085 B2 | 11/2014 | Canale et al. | |
| 9,296,194 B2 * | 3/2016 | Canale | H01L 21/67092 |
| 2002/0035853 A1 | 3/2002 | Brown et al. | |
| 2002/0104616 A1 | 8/2002 | De et al. | |
| 2003/0134490 A1 | 7/2003 | Inuzuka | |
| 2006/0286768 A1 | 12/2006 | Arana et al. | |
| 2008/0041833 A1 | 2/2008 | Cavallaro et al. | |
| 2009/0166930 A1 | 7/2009 | Fujita et al. | |
| 2009/0189054 A1 | 7/2009 | Campidell et al. | |
| 2010/0194015 A1 | 8/2010 | Vekstein et al. | |
| 2011/0024047 A1 | 2/2011 | Nguyen et al. | |
| 2012/0080832 A1 | 4/2012 | Woodard et al. | |
| 2014/0262053 A1 | 9/2014 | Canale et al. | |
| 2015/0034131 A1 | 2/2015 | Canale et al. | |
| 2016/0005637 A1 | 1/2016 | Woodard et al. | |
| 2016/0167359 A1 | 6/2016 | Woodard et al. | |

FOREIGN PATENT DOCUMENTS

| | | |
|---|---|---|
| JP | 2007-294717 | 11/2007 |
| TW | 2010207989 | 2/2012 |
| WO | WO 2011/156292 | 12/2011 |

OTHER PUBLICATIONS ferroceramic.com/corning_table.htm, Internet Retrieval date of Sep. 29, 2013, 2 pages.
"3M™ Wafer Support System", from solutions.3m.com.tw/3MContentRetrievaiAPI/BlobServlet?Imd=1297652594000&locale=zh_TW&assetType=MMM_Image&assetId=1273676279521&blobAttribute=ImageFile, © 2009, Internet Retrieval date of Sep. 29, 2013, 4 pages.
International Search Report and Written Opinion re Application No. PCT/US2011/039335, dated Feb. 28, 2012.
International Preliminary Report on Patentability in PCT/US2011/039335, dated Dec. 10, 2012.

* cited by examiner

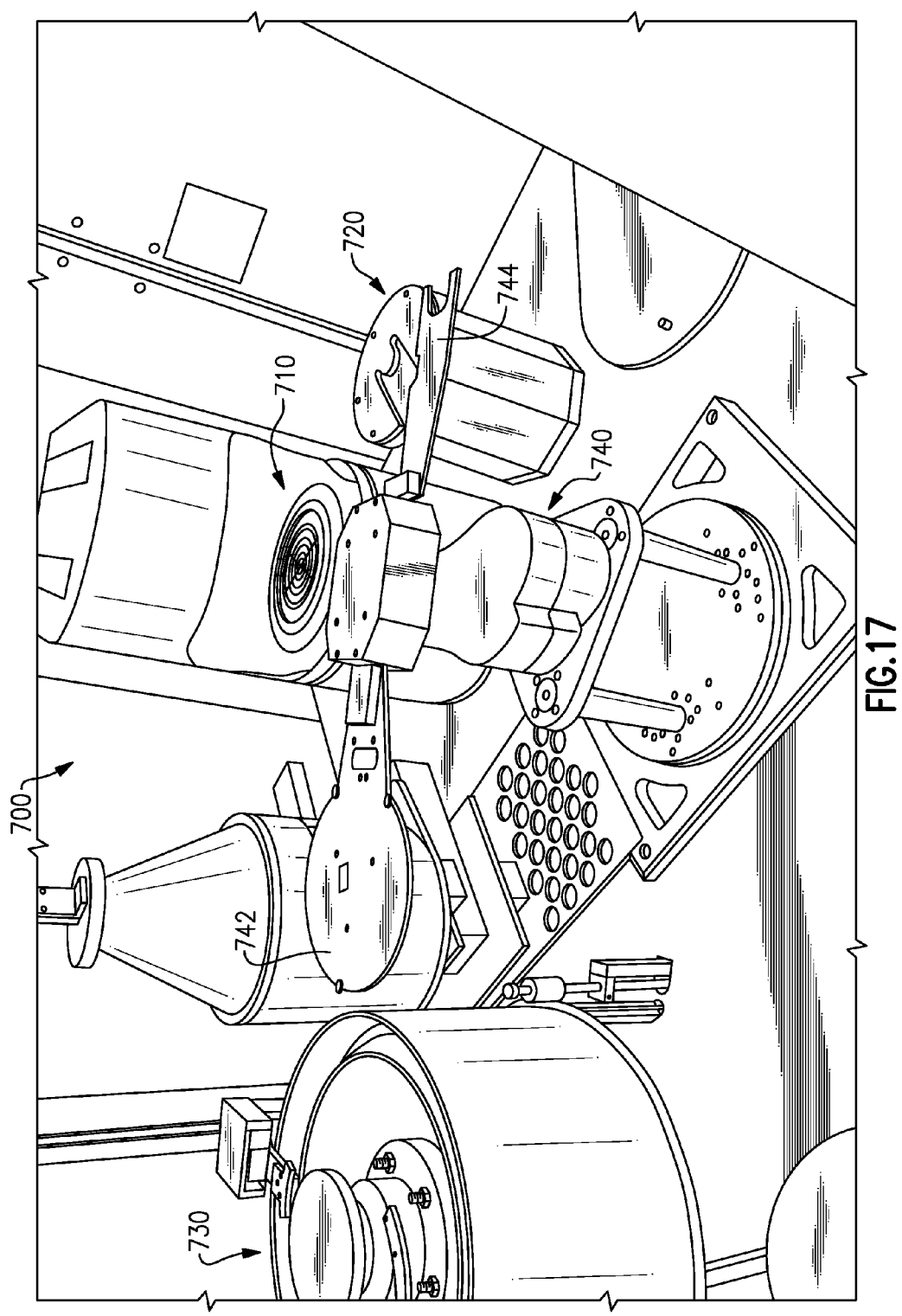

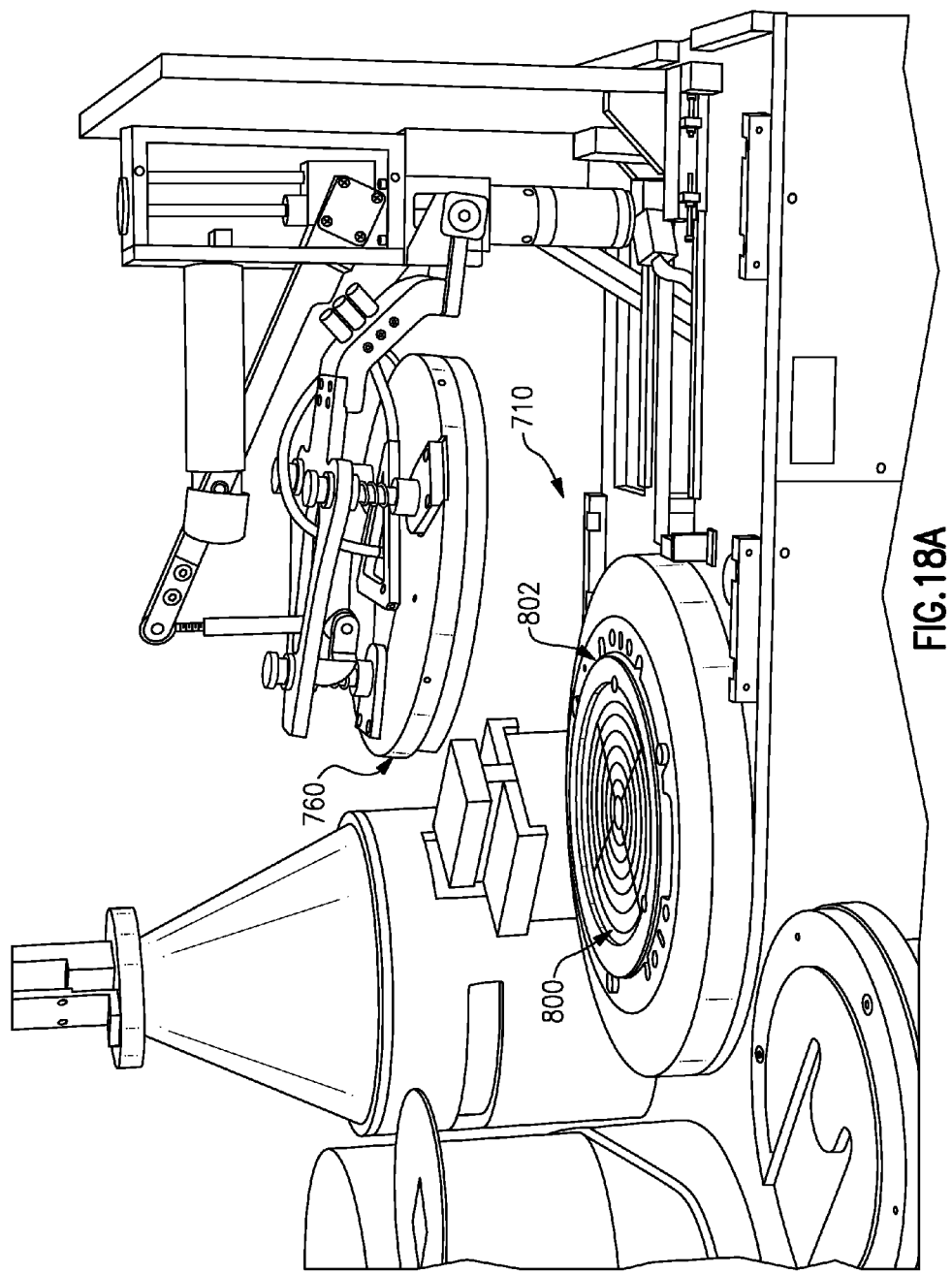

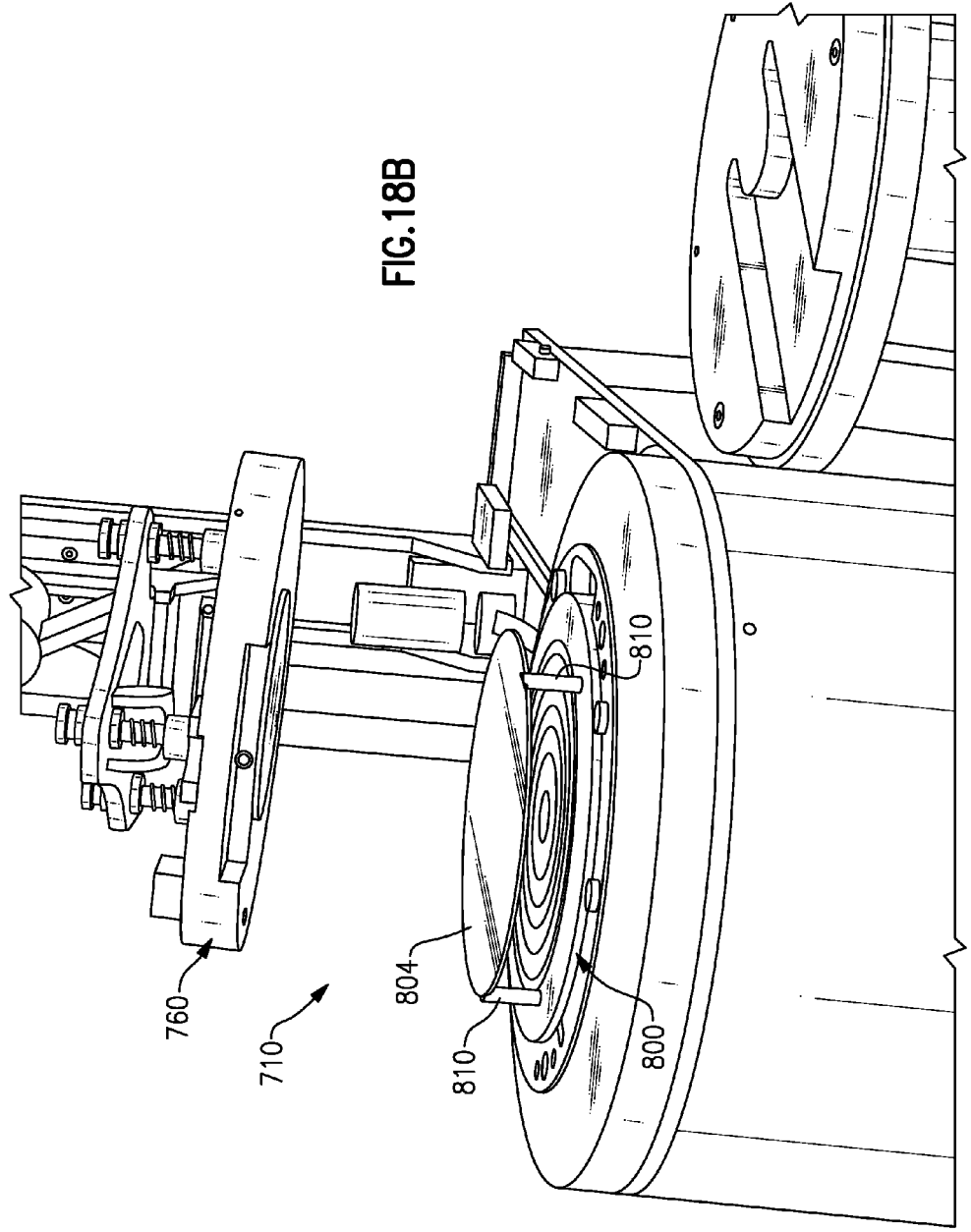

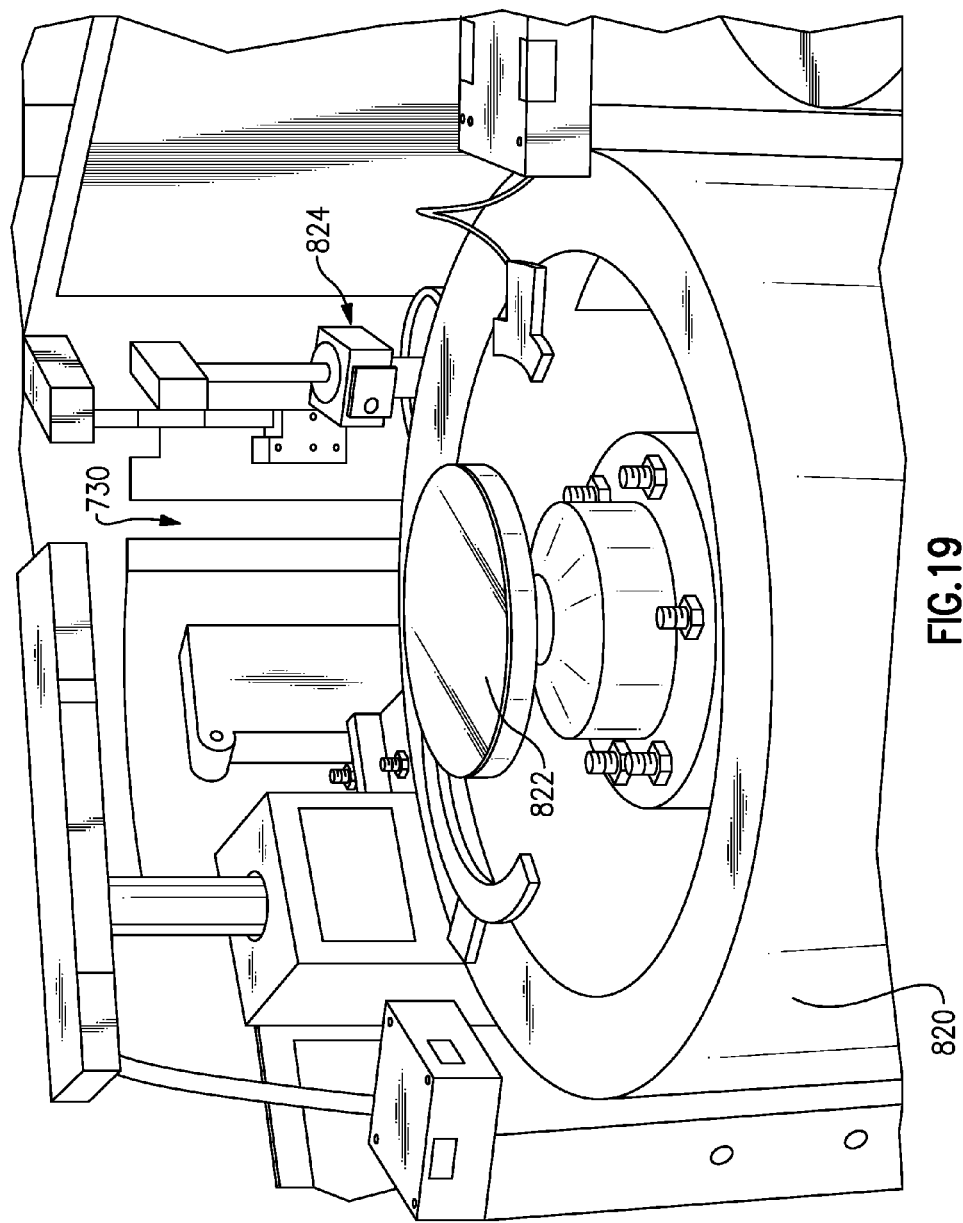

DEBONDERS WITH A RECESS AND A SIDE WALL OPENING FOR SEMICONDUCTOR FABRICATION

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

The present disclosure generally relates to the field of semiconductor wafer processing technology, and more particularly, to systems and methods for debonding a wafer from a carrier plate.

Description of the Related Art

In certain wafer processing operations, a wafer can be mounted to a plate for support and to facilitate handling of wafer. Such a mounting process is sometimes referred to as a bonding process, and can be achieved by, for example, using an adhesive.

Once the plate is no longer needed, the wafer and the plate can be separated in a process sometimes referred to as a debonding process. To facilitate such a process, the bonded assembly of the wafer and plate can be heated to soften the adhesive for easier separation.

SUMMARY

In accordance with several implementations, the present disclosure relates to an apparatus for separating a wafer from a plate. The apparatus includes a base having a first surface and a second surface offset from the first surface so as to define a first recess having a side wall with a height. The first recess has a lateral dimension that is sufficiently large to accommodate a wafer joined to a plate as an assembly. The side wall's height can be less than or equal to the wafer's thickness. The base can further include at least one guiding feature. The apparatus further includes a paddle dimensioned to be guided by the at least one guiding feature, such that when the assembly is positioned on the base with the wafer received by the recess, the paddle is capable of engaging an edge of the plate to provide a shear force to the plate as the paddle is pushed in a lateral direction and guided by the at least one guiding feature.

In accordance with some embodiments, the paddle can define a recess on its side facing the assembly, with the recess having a lateral dimension that is sufficiently large to accommodate the plate. The recess can have a sidewall that dimensioned to engage the edge of the plate and provide the shear force to the plate. The lateral dimension of the recess on the paddle can be larger than the lateral dimension of the first recess on the base so as to allow the recess on the paddle to receive an oversized plate. The paddle can define an aperture so as to allow viewing of the plate positioned in the recess of the paddle.

In a number of embodiments, the at least one guiding feature can include guiding slots formed on two opposing sides of the base. The slots can be dimensioned to receive two opposing edges of the paddle. The guiding slots can be further dimensioned to allow lateral motion of the paddle in a direction that is substantially parallel to the first surface.

In certain embodiments, the second surface of the first recess on the base can define a deeper recess dimensioned to facilitate handling of the wafer positioned in the first recess.

According to some embodiments, the first surface of the base can further define a second recess that is laterally distanced from the first recess and having a lateral dimension that is sufficiently large to accommodate the plate that has been separated from the wafer by the application of the shear force applied to the plate. The lateral dimension of the second recess can be larger than the lateral dimension of the first recess so as to allow the second recess to receive an oversized plate.

In certain embodiments, the paddle can further include a handle configured to allow application of the shear force by an operator. The handle can be disposed on the paddle such that the shear force applied by the operator is at a lateral position that is behind a lateral position where the paddle engages the edge of the plate. The handle can be disposed on the paddle such that the shear force applied by the operator is at a lateral position that is ahead of a lateral position where the paddle engages the edge of the plate.

In a number of embodiments, the second surface of the first recess can define one or more vacuum forming features dimensioned to allow suction holding of the plate upon application of vacuum through the one or more vacuum forming features. The one or more vacuum forming features can include a plurality of grooves in communication with one or more suction forming holes.

In a number of implementations, the present disclosure relates to a method for separating a wafer from a plate. The method includes positioning an assembly of a wafer and a plate on a surface so that the wafer engages the surface and is inhibited from sliding along the surface. The method further includes applying a shear force on an edge of the plate so as to yield a sliding motion of the plate relative to the wafer, with the wafer inhibited from sliding along the surface so that the plate separates from the wafer by its sliding motion.

In certain implementations, the method can further include applying heat to the assembly positioned on the surface. In certain embodiments, the method can further include applying suction to the surface so as to further inhibit the wafer from sliding along the surface.

According to some implementations, the present disclosure relates to an apparatus having a means for holding an assembly of a wafer bonded to a plate, and a means for separating the wafer from the plate by applying a force to and moving one of the wafer and the plate while the other of the wafer and the plate is inhibited from moving due to the force.

In some embodiments, the force can be applied in a direction having a component that is parallel to a plane defined by the assembly. The force can be applied to the plate and the wafer can be inhibited from moving due to the force.

In certain implementations, the present disclosure relates to a debonding chuck for holding an assembly of a wafer and a plate bonded together, where the plate has a lateral dimension that is larger than a lateral dimension of the wafer such that the assembly includes a peripheral area on the plate that is not covered by the wafer. The chuck includes a first surface that defines a recess having a lateral dimension that is sufficiently large to accommodate the lateral dimension of the wafer, but less than the lateral dimension of the plate. When the assembly with the wafer facing the recess is positioned on the chuck for debonding, at least a portion of the peripheral area of the plate engages at least a portion of the first surface to remain outside of the recess while the wafer is substantially within the recess. The chuck further includes a second surface disposed in the recess and separated from the first surface so as to define a depth of the recess. The second surface defines at least one suction opening configured to facilitate delivery of a suction force to the wafer via the recess. The depth is selected to be greater than the wafer's thickness such that when the wafer is debonded from the plate by the suction force, the wafer is allowed to become separated from the plate and engage the second surface while the plate remains engaged to the first surface.

In some embodiments, the recess can have a cylindrical shape having the lateral dimension as its diameter and the depth as its height.

According to a number of embodiments, the depth of the recess can be further selected to limit the amount of flex experienced by the wafer as it becomes separated from the plate. In certain embodiments, the depth of the recess can be selected to have a value that is greater than the wafer's thickness and less than about twice the wafer's thickness. In certain embodiments, the depth of the recess can be selected to have a value that is greater than the wafer's thickness by an amount in a range of about 0.001" to 0.002".

In a number of embodiments, the at least one suction opening on the second surface can include one or more grooves configured to be in communication with an external vacuum source. The one or more grooves can be distributed on the second surface so as to distribute the suction force provided to the wafer. The one or more grooves can include a plurality of grooves shaped in concentric circles about a center of the second surface. The one or more grooves can include at least one groove that extends radially from a center of the second surface. The one or more grooves can be configured such that the distributed suction force results in the separation of the wafer from the plate begins at the wafer's periphery.

In accordance with a number of embodiments, the first and second surfaces can be joined by a side wall. In certain embodiments, the first second surfaces can be substantially parallel. In certain embodiments, the side wall can be substantially perpendicular to both of the first and second surfaces.

In certain embodiments, the side wall can define at least one opening dimensioned to limit a pressure difference between the recess and outside of the recess during the application of the suction force.

According to some embodiments, the second surface can further define at least one relief opening in communication with at least a portion of the suction opening and outside of the recess so as to limit a pressure difference between the recess and the at least one suction opening when the wafer engages the second surface and experiencing the suction force.

In some embodiments, at least a portion of the second surface can be configured to be in thermal contact with a heat source so as to allow heating of the assembly positioned on the chuck.

In a number of implementations, the present disclosure relates to a wafer debonding system having the debonding chuck summarized above.

In some embodiments, the system can include a manual debonding system configured so that the positioning of the assembly on the chuck is performed manually by an operator. In certain embodiments, the system can further include a control component configured to facilitate an automated sequence of debonding operations. The sequence of debonding operations can include positioning of the assembly on the chuck and removal of the separated wafer and the plate from the chuck.

In certain embodiments, the system can further include a robotic component configured to perform the sequence of debonding operations. In certain embodiments, the system can further include a lift mechanism capable of being in extended and retracted orientations. The lift mechanism in its extended orientation can be configured to receive the assembly from the robotic component at a location spaced from the first surface. The lift mechanism in its retracted orientation can be configured to position the assembly on the chuck. In certain embodiments, the lift mechanism can include a plurality of lift pins disposed along the first surface so as to allow the pins' movements between the extended and retracted orientations without directly touching the wafer. In certain embodiments, each of the plurality of lift pins is configured to be capable of being controlled independently.

In some embodiments, the system can further include a cleaning component configured to be capable of cleaning the separated wafer.

In a number of implementations, the present disclosure relates to a method for debonding a wafer from an oversized plate. The method includes positioning an assembly of a wafer and a plate on a vacuum chuck that is dimensioned to support the assembly by an oversized portion of the plate such that the wafer faces the vacuum chuck. The method further includes applying a suction to the vacuum chuck so as to yield a suction force being applied to the wafer. The plate is inhibited from following the wafer due to the vacuum chuck supporting the oversized portion of the plate so that the wafer is pulled away from the plate by the suction force. The method further includes receiving the separated wafer in a recess defined by the vacuum chuck.

In some embodiments, the method can further include removing the plate from its supported position on the vacuum chuck. In certain embodiments, the method can further include removing the wafer from the recess.

In a number of embodiments, the method can further include applying heat to the assembly positioned on the chuck.

According to some embodiments, the applying of the suction to the vacuum chuck can include applying a distributed suction force to the wafer. The distributed suction force applied to the wafer can result in the wafer being separated from the oversized plate starting from the wafer's edge.

In certain implementations, the present disclosure relates to a debonding apparatus for separating a wafer from a plate. The plate has a lateral dimension that is larger than a lateral dimension of the wafer such that an assembly of the wafer and the plate includes a peripheral area on the plate that is not covered by the wafer. The apparatus includes a chuck having a vacuum surface configured to receive the wafer of the assembly. The apparatus further includes one or more separation members disposed relative to the vacuum surface so as to allow the one or more separation members to engage at least a portion of the plate and move the at least a portion of the plate without directly touching the wafer so as to allow separation of the plate away from the wafer by moving the one or more separation members when the wafer is held on the vacuum surface by application of vacuum.

In a number of embodiments, the one or more separation members can include one or more lift members. The one or more lift members can include a plurality of lift pins dimensioned and disposed so as to engage the peripheral area on the plate but not the wafer. At least one of the plurality of lift pins can be configured to be capable of moving independently from other lift pins.

According to some embodiments, the one or more lift members can include a blade dimensioned and disposed so as to engage the peripheral area on the plate but not the wafer.

In some embodiments, the one or more separation members can include a suction member disposed on the side of the plate that is opposite from the side engaging the wafer. The suction member can be disposed away from the plate's center so as to allow one side of the plate to be separated first from the wafer.

In certain embodiments, the vacuum surface can be defined by a floor surface of a recess having a lateral dimension that is larger than the lateral dimension of the wafer, but less than the lateral dimension of the plate. In certain embodiments, the recess can have a depth that can be selected to be greater than the wafer's thickness such that upon application of the vacuum, the wafer can be pulled away from the plate by the suction force and allowed to become separated from the plate and engage the vacuum surface of the recess.

In a number of implementations, the present disclosure relates to an automated debonding system having the debonding apparatus summarized above.

In a number of implementations, the present disclosure relates to an apparatus having a means for holding an assembly of a wafer bonded to a plate, and a means for separating the wafer from the plate by applying a force to and moving one of the wafer and the plate while the other of the wafer and the plate is inhibited from moving due to the force.

In some implementations, the present disclosure relates to a system for debonding a wafer bonded to a plate. The plate has a lateral dimension that is larger than a lateral dimension of the wafer such that the bonded wafer and plate assembly includes a peripheral area on the plate that is not covered by the wafer. The system includes a base having a first surface and a second surface offset from the first surface so as to define a recess having a side wall with a height. The recess has a lateral dimension that is sufficiently large to accommodate the lateral dimension of the wafer, but less than the lateral dimension of the plate, such that when the assembly with the wafer facing the recess is positioned on the base for debonding, at least a portion of the wafer is within the recess while the plate remains outside of the recess. The system further includes a force applicator configured provide a separating force to at least one of the wafer and the plate. The height of the side wall is selected so that upon application of the separating force, one of the wafer and the plate is inhibited from moving in a direction along the separating force while the other one moves in the direction of the separating force.

In some embodiments, the base and the force applicator can be configured so as to allow the force applicator to slide along a direction that is substantially parallel to a plane defined by the assembly, such that the separating force provides a shear force between the plate and the wafer. In certain embodiments, the side wall of the recess can be configured to engage a leading edge of the wafer and the force applicator can be configured to engage a lagging edge of the plate so that upon application of the shear force, the plate can be allowed to slide along the direction while the engagement of the leading edge of the wafer with the side wall can inhibit the movement of the wafer along the direction.

In a number of embodiments, the base can be configured so that the height of the side wall can be greater than the thickness of the wafer. The second surface can have one or more suction features. The force applicator can be in communication with the suction features and configured to provide suction to the recess via the suction features, such that the separating force can provide a pulling force on the wafer along a direction having a component perpendicular to the assembly. In certain embodiments, at least a portion of the first surface can be configured to engage at least a portion of the peripheral area on the plate so that upon application of the pulling force, the wafer can be allowed to be pulled away from the plate while the plate's engagement with the first surface can inhibit the movement of the plate along the direction.

According to certain implementations, the present disclosure relates to a wafer holding device. The device includes a plate having a surface dimensioned to receive a wafer thereon. The device further includes a plurality of features formed on the surface and distributed along the surface so that the wafer positioned on the surface is in contact with at least some of the features and offset from the surface.

In a number of embodiments, the device can further include one or more wafer-retaining features formed along an edge of the plate. The retaining features can be configured so that when the plate is oriented with the edge downward and the surface facing upward and at an angle away from horizontal, the wafer held thereon can engage the retaining features and can be inhibited from falling off the plate. The one or more wafer-retaining features can include two J-shaped hook features on the side of the first surface. The two hook features can be by an open space dimensioned to allow drainage of the liquid.

In certain embodiments, the plurality of features can include a plurality of bumps. Each of the plurality of bumps can include a curves surface dimensioned to engage the wafer.

In some embodiments, the features can be dimensioned and distributed to allow efficient movement of liquid relative to the wafer during cleaning and drying operations.

In some embodiments, the edge having the retaining features can have a curved shape to conform to the curved edge of the wafer.

In a number of embodiments, the plate can define a handling tab on an edge opposite from the edge having the retaining features.

According to some implementations, the present disclosure relates to a cassette for holding one or more of the wafer holding device as summarized above. The cassette can be configured to be capable of being in collection orientation and a cleaning orientation, The cassette can be further configured so that when in the collection orientation, the wafer holding device can be held in the cassette approximately horizontally, and when in the cleaning orientation, the wafer holding device can be held at an angle away from the vertical so that the wafer is retained on the plate.

According to some embodiments, the angle can be in a range of about 1 degree to 60 degrees relative to the vertical, about 10 degrees to 45 relative to the vertical, or about 20 degrees to 35 relative to the vertical.

According to some implementations, the present disclosure relates to a cassette for holding one or more of the wafer holding device as summarized above. The cassette can be configured so the wafer holding device can be held in the cassette approximately horizontally to allow plasma cleaning of a wafer held on the wafer holding device.

According to some embodiments, the cassette can further include a top cover disposed above a location where the uppermost wafer holding device is held. The top cover can be dimensioned to provide a cover for a wafer on the uppermost wafer holding device to provide the wafer with a similar plasma cleaning environment as other wafers held underneath.

In some implementations, the present disclosure relates to a method for cleaning a wafer. The method includes placing a wafer to be cleaned on a wafer-holder. The method further includes positioning the wafer-holder with the wafer thereon so that the wafer-holder is held at an angle away from the vertical. The method further includes applying a cleaning solution to the wafer held at the angle. The method further includes draining the cleaning solution from the wafer, with the wafer being held at the angle facilitating the draining.

In some implementations, the present disclosure relates to a method for plasma cleaning a wafer. The method includes placing a wafer to be plasma cleaned on a wafer-holder. The method further includes positioning a plurality of the wafer-holders with wafers thereon so that the wafers are held in a spaced stack. The method further includes providing a cover above the uppermost one of the wafers. The method further includes applying a cleaning plasma to the wafers. The cover provides an exposure to the cleaning plasma to the uppermost wafer that is similar to the wafers underneath the uppermost wafer.

In certain implementations, the present disclosure relates to an optically transparent disk for bonding a semiconductor wafer thereto to provide support for the wafer. The disk can have a diameter and formed from a chemical resistant material. The diameter of the disk can be larger than the wafer's diameter by approximately 3% or more, by approximately 5% or more, by approximately 6% or more, or by approximately 10% or more. In certain embodiments, the material can include sapphire or borosilicate.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

The present disclosure relates to U.S. patent application Ser. No. 12/898,648, titled "FIXTURES AND METHODS FOR UNBONDING WAFERS BY SHEAR FORCE," and U.S. patent application Ser. No. 12/898,627, titled "DEVICES AND METHODOLOGIES FOR HANDLING WAFERS," each filed on even date herewith and each hereby incorporated by reference herein in its entirety.

BRIEF DESCRIPTION OF THE DRAWINGS

FIG. 17 shows that in certain embodiments, the debonding chuck of FIG. 8 can be implemented in an automated debonding system.

FIG. 18A shows the debonding chuck implemented in the example automated system of FIG. 17.

FIG. 18B shows that in certain embodiments, the automated system can include one or more devices for handling the wafer-carrier assembly and the separated wafer and carrier.

FIG. 19 shows a cleaning station that is part of the example automated system of FIG. 17.

DETAILED DESCRIPTION OF CERTAIN EMBODIMENTS

The headings provided herein, if any, are for convenience only and do not necessarily affect the scope or meaning of the claimed invention.

Figure 1:
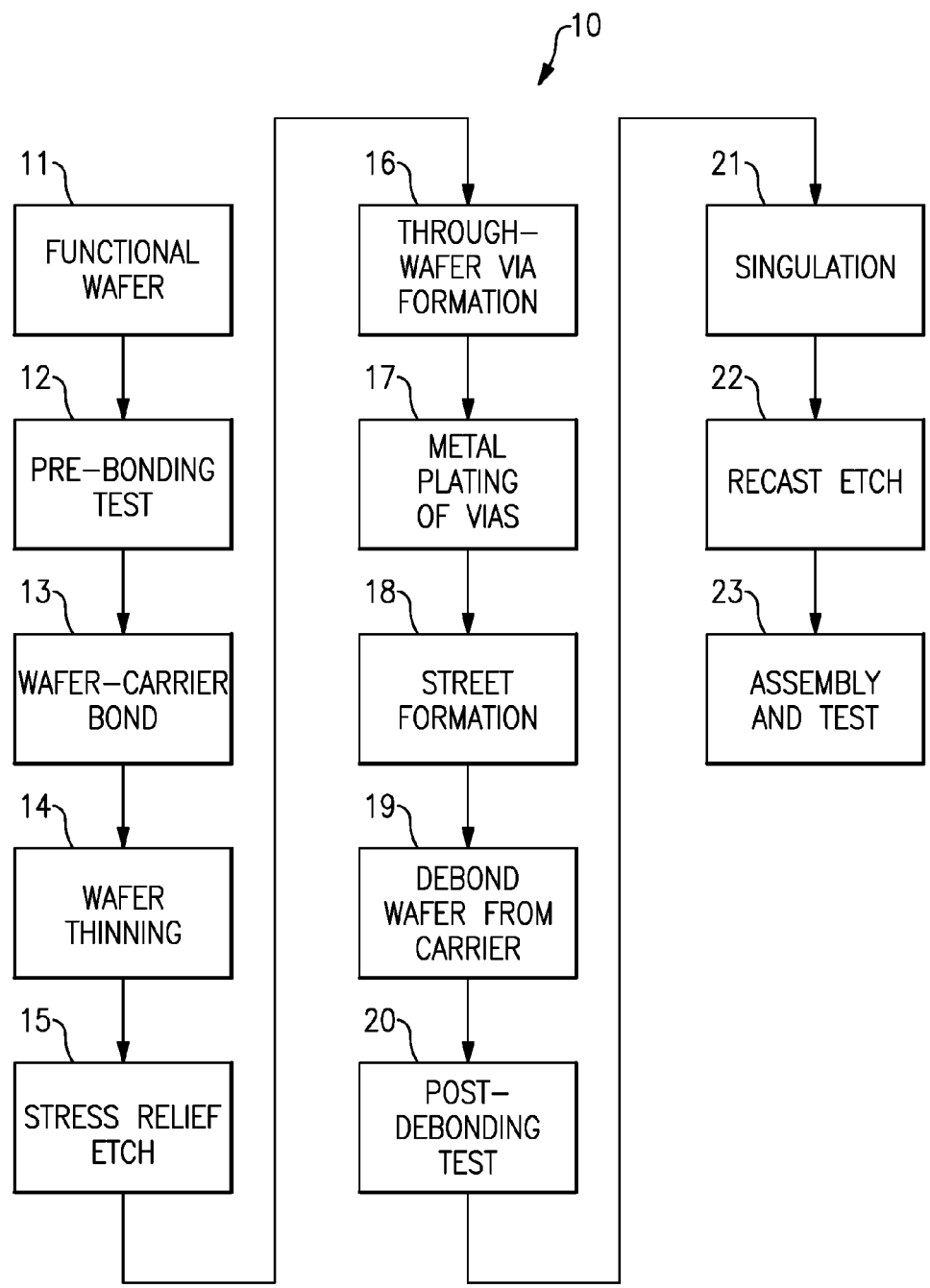
FIG. 1 shows an example sequence of wafer processing for forming through-wafer features such as vias.

Provided herein are various methodologies and devices for processing wafers such as semiconductor wafers. FIG. 1 shows an example of a process 10 where a functional wafer is further processed to form through-wafer features such as vias and back-side metal layers. As further shown in FIG. 1, the example process 10 can include bonding of a wafer to a carrier for support and/or to facilitate handling during the various steps of the process, and debonding of the wafer from the carrier upon completion of such steps. FIG. 1 further shows that such a wafer separated from the carrier can be further processed so as to yield a number of dies.

In the description herein, various examples are described in the context of GaAs substrate wafers. It will be understood, however, that some or all of the features of the present disclosure can be implemented in processing of other types of semiconductor wafers. Further, some of the features can also be applied to situations involving non-semiconductor wafers.

In the description herein, various examples are described in the context of back-side processing of wafers. It will be understood, however, that some or all of the features of the present disclosure can be implemented in front-side processing of wafers.

Figure 2A:
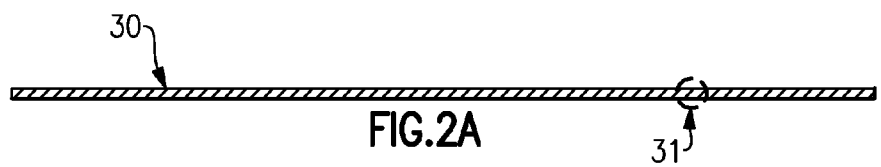
FIGS. 2A-2V show examples of structures at various stages of the processing sequence of FIG. 1.

In the process 10 of FIG. 1, a functional wafer can be provided (block 11). FIG. 2A depicts a side view of such a wafer 30 having first and second sides. The first side can be a front side, and the second side a back side.

Figure 2B:
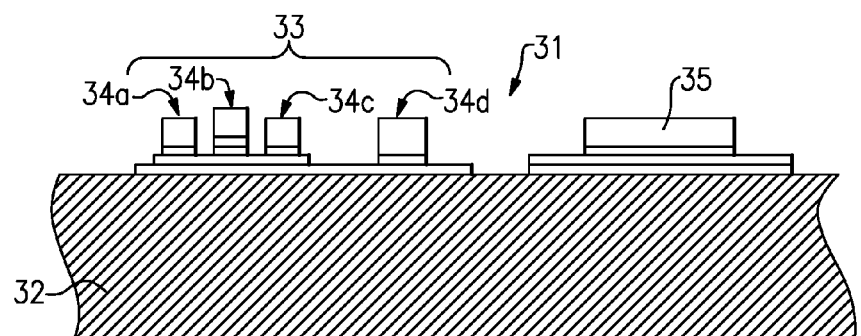

FIG. 2B depicts an enlarged view of a portion 31 of the wafer 30. The wafer 30 can include a substrate layer 32 (e.g., a GaAs substrate layer). The wafer 30 can further include a number of features formed on or in its front side. In the example shown, a transistor 33 and a metal pad 35 are depicted as being formed the front side. The example transistor 33 is depicted as having an emitter 34b, bases 34a, 34c, and a collector 34d. Although not shown, the circuitry can also include formed passive components such as inductors, capacitors, and source, gate and drain for incorporation of planar field effect transistors (FETs) with heterojunction bipolar transistors (HBTs). Such structures can be formed by various processes performed on epitaxial layers that have been deposited on the substrate layer.

Referring to the process 10 of FIG. 1, the functional wafer of block 11 can be tested (block 12) in a number of ways prior to bonding. Such a pre-bonding test can include, for example, DC and RF tests associated with process control parameters.

Figure 2C:
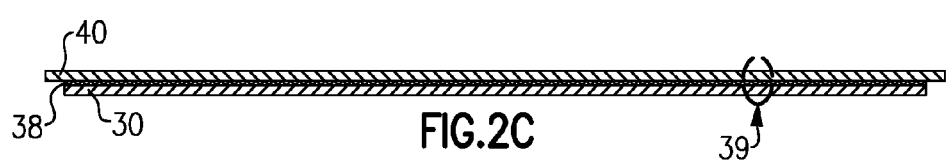

Upon such testing, the wafer can be bonded to a carrier (block 13). In certain implementations, such a bonding can be achieved with the carrier above the wafer. Thus, FIG. 2C shows an example assembly of the wafer 30 and a carrier 40 (above the wafer) that can result from the bonding step 13. In certain implementations, the wafer and carrier can be bonded using temporary mounting adhesives such as wax or commercially available Crystalbond™. In FIG. 2C, such an adhesive is depicted as an adhesive layer 38.

In certain implementations, the carrier 40 can be a plate having a shape (e.g., circular) similar to the wafer it is supporting. Preferably, the carrier plate 40 has certain physical properties. For example, the carrier plate 40 can be relatively rigid for providing structural support for the wafer. In another example, the carrier plate 40 can be resistant to a number of chemicals and environments associated with various wafer processes. In another example, the carrier plate 40 can have certain desirable optical properties to facilitate a number of processes (e.g., transparency to accommodate optical alignment and inspections).

Materials having some or all of the foregoing properties can include sapphire, borosilicate (also referred to as Pyrex), quartz, and glass (e.g., SCG72).

In certain implementations, the carrier plate 40 can be dimensioned to be larger than the wafer 30. Thus, for circular wafers, a carrier plate can also have a circular shape with a diameter that is greater than the diameter of a wafer it supports. Such a larger dimension of the carrier plate can facilitate easier handling of the mounted wafer, and thus can allow more efficient processing of areas at or near the periphery of the wafer.

Tables 1A and 1B list various example ranges of dimensions and example dimensions of some example circular-shaped carrier plates that can be utilized in the process 10 of FIG. 1.

TABLE 1A

| Carrier plate diameter range | Carrier plate thickness range | Wafer size |
| --- | --- | --- |
| Approx. 100 to 120 mm | Approx. 500 to 1500 um | Approx. 100 mm |
| Approx. 150 to 170 mm | Approx. 500 to 1500 um | Approx. 150 mm |
| Approx. 200 to 220 mm | Approx. 500 to 2000 um | Approx. 200 mm |
| Approx. 300 to 320 mm | Approx. 500 to 3000 um | Approx. 300 mm |

TABLE 1B

| Carrier plate diameter | Carrier plate thickness | Wafer size |
| --- | --- | --- |
| Approx. 110 mm | Approx. 1000 um | Approx. 100 mm |
| Approx. 160 mm | Approx. 1300 um | Approx. 150 mm |
| Approx. 210 mm | Approx. 1600 um | Approx. 200 mm |
| Approx. 310 mm | Approx. 1900 um | Approx. 300 mm |

Figure 2D:
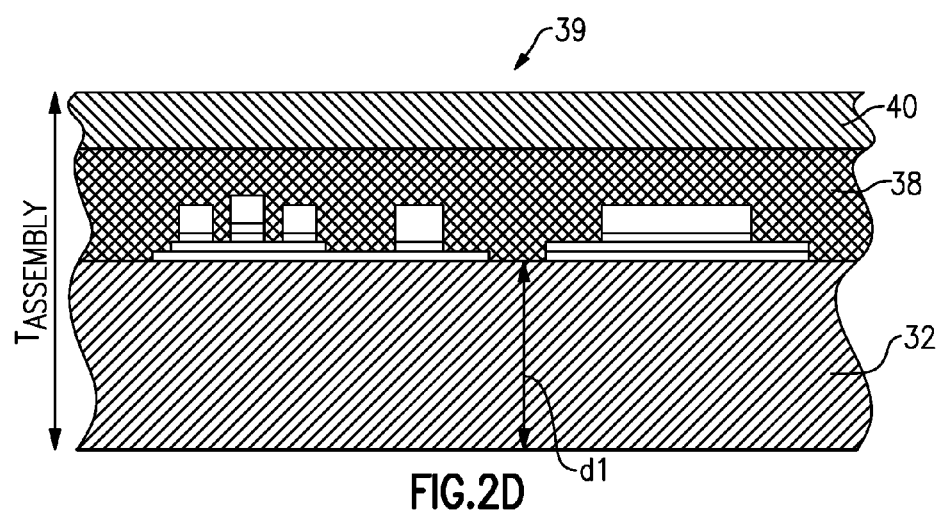

An enlarged portion 39 of the bonded assembly in FIG. 2C is depicted in FIG. 2D. The bonded assembly can include the GaAs substrate layer 32 on which are a number of devices such as the transistor (33) and metal pad (35) as described in reference to FIG. 2B. The wafer (30) having such substrate (32) and devices (e.g., 33, 35) is depicted as being bonded to the carrier plate 40 via the adhesive layer 38.

As shown in FIG. 2D, the substrate layer 32 at this stage has a thickness of d1, and the carrier plate 40 has a generally fixed thickness (e.g., one of the thicknesses in Table 1). Thus, the overall thickness ($T_{assembly}$) of the bonded assembly can be determined by the amount of adhesive in the layer 38.

In a number of processing situations, it is preferable to provide sufficient amount of adhesive to cover the tallest feature(s) so as to yield a more uniform adhesion between the wafer and the carrier plate, and also so that such a tall feature does not directly engage the carrier plate. Thus, in the example shown in FIG. 2D, the emitter feature (34b in FIG. 2B) is the tallest among the example features; and the adhesive layer 38 is sufficiently thick to cover such a feature and provide a relatively uninterrupted adhesion between the wafer 30 and the carrier plate 40.

Figure 2E:
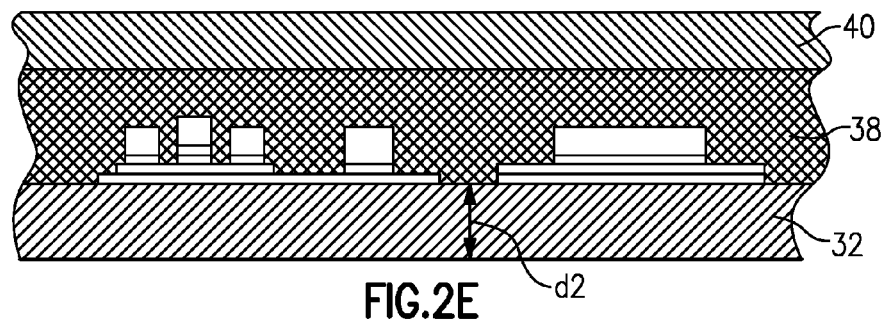

Referring to the process 10 of FIG. 1, the wafer—now mounted to the carrier plate—can be thinned so as to yield a desired substrate thickness in blocks 14 and 15. In block 14, the back side of the substrate 32 can be ground away (e.g., via two-step grind with coarse and fine diamond-embedded grinding wheels) so as to yield an intermediate thickness-substrate (with thickness d2 as shown in FIG. 2E) with a relatively rough surface. In certain implementations, such a grinding process can be performed with the bottom surface of the substrate facing downward.

In block 15, the relatively rough surface can be removed so as to yield a smoother back surface for the substrate 32. In certain implementations, such removal of the rough substrate surface can be achieved by an $O_2$ plasma ash process, followed by a wet etch process utilizing acid or base chemistry. Such an acid or base chemistry can include HCl, $H_2SO_4$, $HNO_3$, $H_3PO_4$, $H_3COOH$, $NH_4OH$, $H_2O_2$, etc., mixed with $H_2O_2$ and/or $H_2O$. Such an etching process can provide relief from possible stress on the wafer due to the rough ground surface.

Figure 2F:
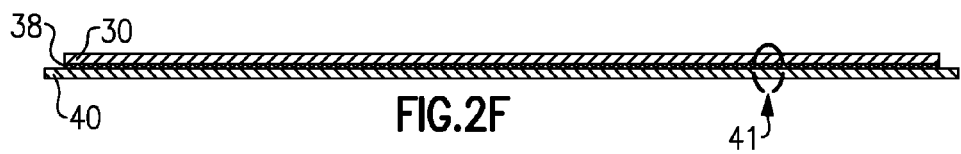
Figure 2G:
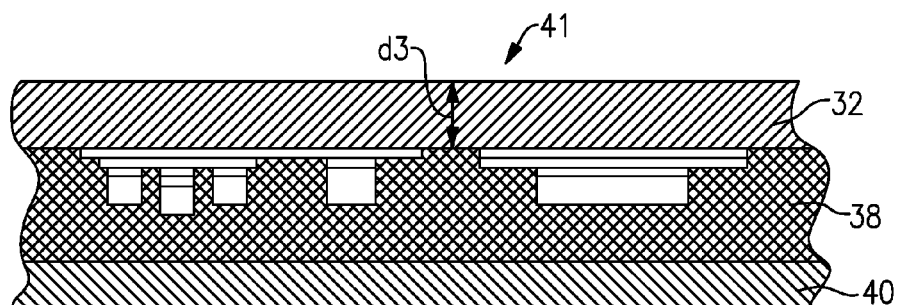

In certain implementations, the foregoing plasma ash and wet etch processes can be performed with the back side of the substrate 32 facing upward. Accordingly, the bonded assembly in FIG. 2F depicts the wafer 30 above the carrier plate 40. FIG. 2G shows the substrate layer 32 with a thinned and smoothed surface, and a corresponding thickness of d3.

By way of an example, the pre-grinding thickness (d1 in FIG. 2D) of a 150 mm (also referred to as "6-inch") GaAs substrate can be approximately 675 μm. The thickness d2 (FIG. 2E) resulting from the grinding process can be in a range of approximately 102 μm to 120 μm. The ash and etching processes can remove approximately 2 μm to 20 μm of the rough surface so as to yield a thickness of approximately 100 μm. (d3 in FIG. 2G). Other thicknesses are possible.

In certain situations, a desired thickness of the back-side-surface-smoothed substrate layer can be an important design parameter. Accordingly, it is desirable to be able to monitor the thinning (block 14) and stress relief (block 15) processes. Since it can be difficult to measure the substrate layer while the wafer is bonded to the carrier plate and being worked on, the thickness of the bonded assembly can be measured so as to allow extrapolation of the substrate layer thickness. Such a measurement can be achieved by, for example, a gas (e.g., air) back pressure measurement system that allows detection of surfaces (e.g., back side of the substrate and the "front" surface of the carrier plate) without contact.

As described in reference to FIG. 2D, the thickness ($T_{assembly}$) of the bonded assembly can be measured; and the thicknesses of the carrier plate 40 and the un-thinned substrate 32 can have known values. Thus, subsequent thinning of the bonded assembly can be attributed to the thinning of the substrate 32; and the thickness of the substrate 32 can be estimated.

Figure 2H:
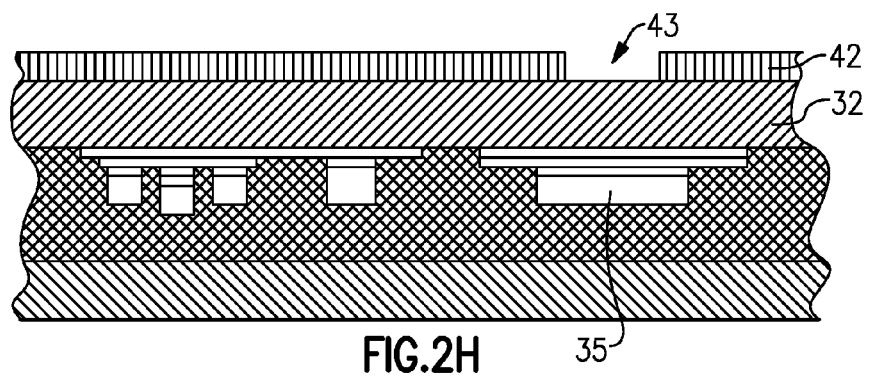
Figure 2I:
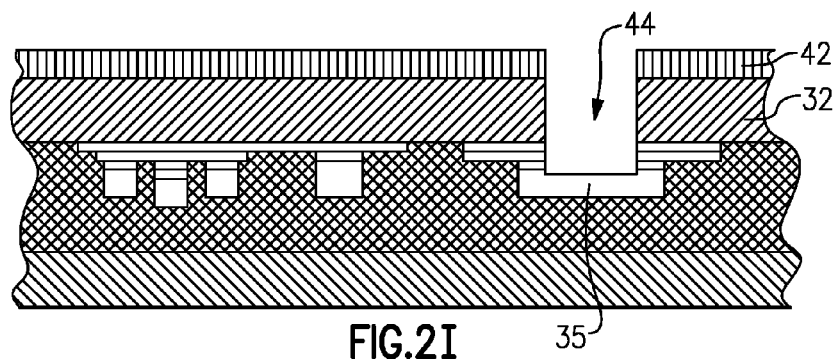
Figure 2J:
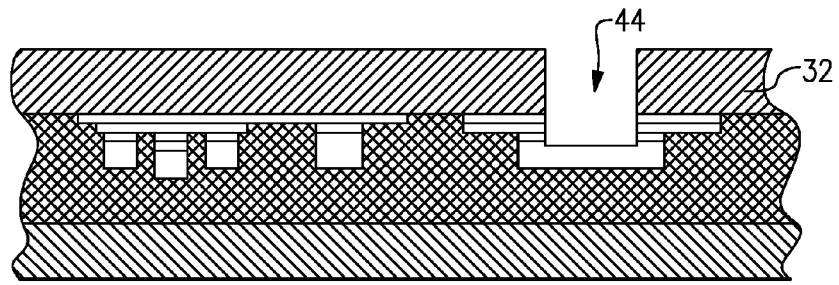

Referring to the process 10 of FIG. 1, the thinned and stress-relieved wafer can undergo a through-wafer via formation process (block 16). FIGS. 2H-2J show different stages during the formation of a via 44. Such a via is described herein as being formed from the back side of the substrate 32 and extending through the substrate 32 so as to end at the example metal pad 35. It will be understood that one or more features described herein can also be implemented for other deep features that may not necessarily extend all the way through the substrate. Moreover, other features (whether or not they extend through the wafer) can be formed for purposes other than providing a pathway to a metal feature on the front side.

To form an etch resist layer 42 that defines an etching opening 43 (FIG. 2H), photolithography can be utilized. Coating of a resist material on the back surface of the substrate, exposure of a mask pattern, and developing of the exposed resist coat can be achieved in known manners. In the example configuration of FIG. 2H, the resist layer 42 can have a thickness in a range of about 15 μm to 20 μm.

To form a through-wafer via 44 (FIG. 2I) from the back surface of the substrate to the metal pad 35, techniques such as dry inductively coupled plasma (ICP) etching (with chemistry such as $BCl_3/Cl_2$) can be utilized. In various implementations, a desired shaped via can be an important design parameter for facilitating proper metal coverage therein in subsequent processes.

FIG. 2J shows the formed via 44, with the resist layer 42 removed. To remove the resist layer 42, photoresist strip solvents such as NMP (N-methyl-2-pyrrolidone) and EKC can be applied using, for example, a batch spray tool. In various implementations, proper removal of the resist material 42 from the substrate surface can be an important consideration for subsequent metal adhesion. To remove residue of the resist material that may remain after the solvent strip process, a plasma ash (e.g., $O_2$) process can be applied to the back side of the wafer.

Figure 2K:
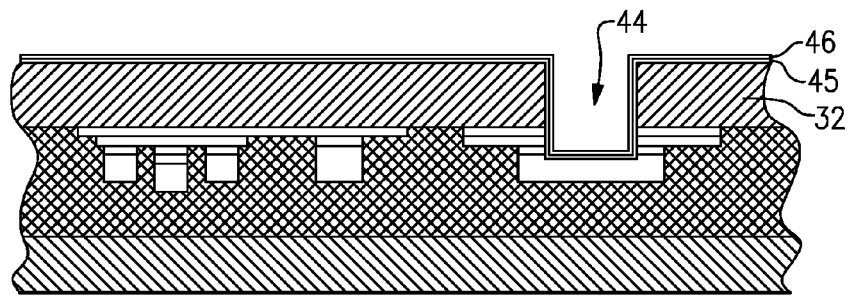
Figure 2L:
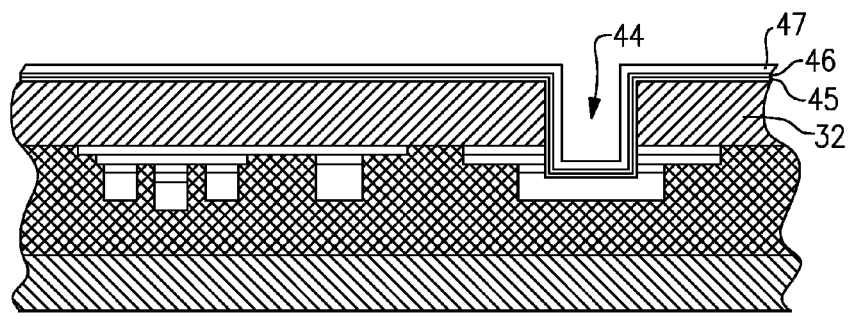

Referring to the process 10 of FIG. 1, a metal layer can be formed on the back surface of the substrate 32 in block 17. FIGS. 2K and 2L show examples of adhesion/seed layers and a thicker metal layer.

FIG. 2K shows that in certain implementations, an adhesion layer 45 such as a nickel vanadium (NiV) layer can be formed on surfaces of the substrate's back side and the via 44 by, for example, sputtering. Preferably, the surfaces are cleaned (e.g., with HCl) prior to the application of NiV. FIG. 2K also shows that a seed layer 46 such as a thin gold layer can be formed on the adhesion layer 45 by, for example, sputtering. Such a seed layer facilitates formation of a thick metal layer 47 such as a thick gold layer shown in FIG. 2L. In certain implementations, the thick gold layer can be formed by a plating technique.

In certain implementations, the gold plating process can be performed after a pre-plating cleaning process (e.g., $O_2$ plasma ash and HCl cleaning). The plating can be performed to form a gold layer of about 3 μm to 6 μm to facilitate the foregoing electrical connectivity and heat transfer functionalities. The plated surface can undergo a post-plating cleaning process (e.g., $O_2$ plasma ash).

The metal layer formed in the foregoing manner forms a back side metal plane that is electrically connected to the metal pad 35 on the front side. Such a connection can provide a robust electrical reference (e.g., ground potential) for the metal pad 35. Such a connection can also provide an efficient pathway for conduction of heat between the back side metal plane and the metal pad 35.

Thus, one can see that the integrity of the metal layer in the via 44 and how it is connected to the metal pad 35 and the back side metal plane can be important factors for the performance of various devices on the wafer. Accordingly, it is desirable to have the metal layer formation be implemented in an effective manner. More particularly, it is desirable to provide an effective metal layer formation in features such as vias that may be less accessible.

Figure 2M:
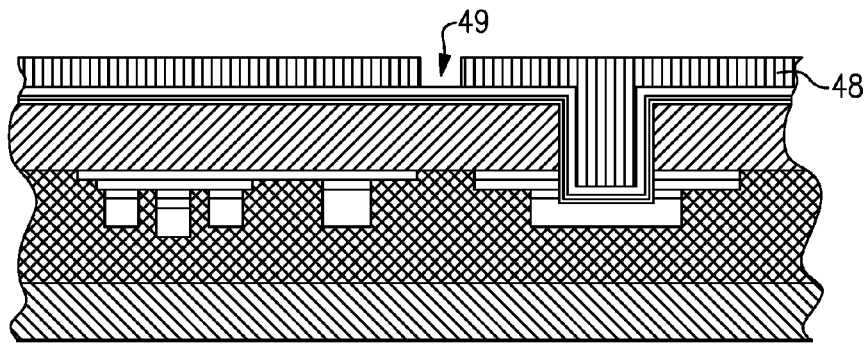
Figure 2N:
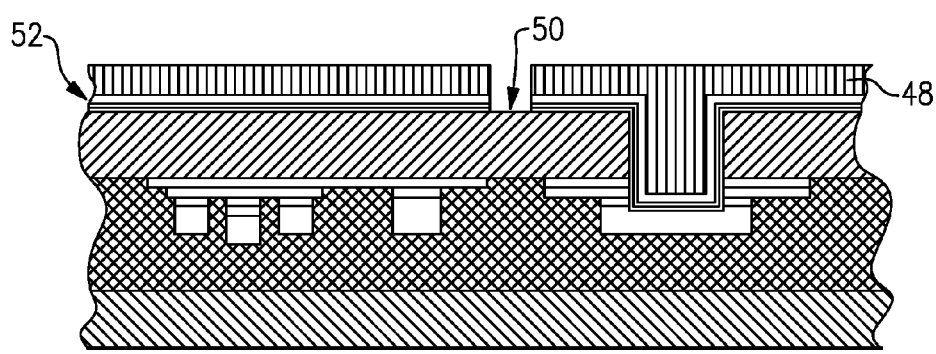
Figure 2O:
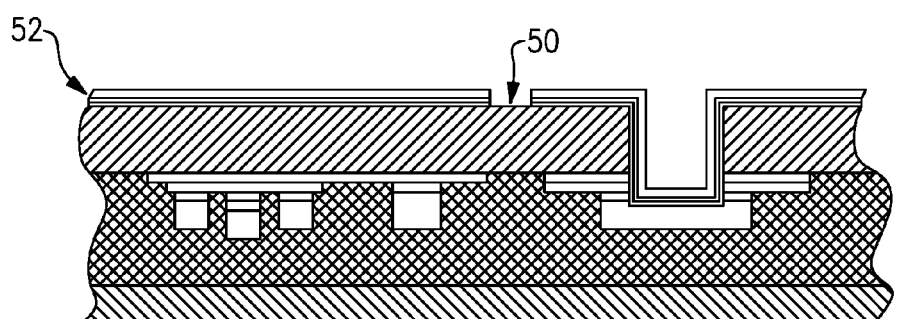

Referring to the process 10 of FIG. 1, the wafer having a metal layer formed on its back side can undergo a street formation process (block 18). FIGS. 2M-2O show different stages during the formation of a street 50. Such a street is described herein as being formed from the back side of the wafer and extending through the metal layer 52 to facilitate subsequent singulation of dies. It will be understood that one or more features described herein can also be implemented for other street-like features on or near the back surface of the wafer. Moreover, other street-like features can be formed for purposes other than to facilitate the singulation process.

To form an etch resist layer 48 that defines an etching opening 49 (FIG. 2M), photolithography can be utilized. Coating of a resist material on the back surface of the substrate, exposure of a mask pattern, and developing of the exposed resist coat can be achieved in known manners.

To form a street 50 (FIG. 2N) through the metal layer 52, techniques such as wet etching (with chemistry such as potassium iodide) can be utilized. A pre-etching cleaning process (e.g., O$_2$ plasma ash) can be performed prior to the etching process. In various implementations, the thickness of the resist 48 and how such a resist is applied to the back side of the wafer can be important considerations to prevent certain undesirable effects, such as via rings and undesired etching of via rim during the etch process.

FIG. 2O shows the formed street 50, with the resist layer 48 removed. To remove the resist layer 48, photoresist strip solvents such as NMP (N-methyl-2-pyrrolidone) can be applied using, for example, a batch spray tool. To remove residue of the resist material that may remain after the solvent strip process, a plasma ash (e.g., O$_2$) process can be applied to the back side of the wafer.

In the example back-side wafer process described in reference to FIGS. 1 and 2, the street (50) formation and removal of the resist (48) yields a wafer that no longer needs to be mounted to a carrier plate. Thus, referring to the process 10 of FIG. 1, the wafer is debonded or separated from the carrier plate in block 19. FIGS. 2P-2R show different stages of the separation and cleaning of the wafer 30.

Figure 2P:
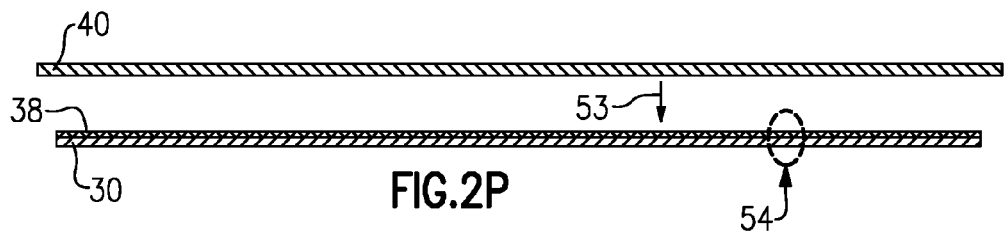

In certain implementations, separation of the wafer 30 from the carrier plate 40 can be performed with the wafer 30 below the carrier plate 40 (FIG. 2P). To separate the wafer 30 from the carrier plate 40, the adhesive layer 38 can be heated to reduce the bonding property of the adhesive. For the example Crystalbond™ adhesive, an elevated temperature to a range of about 130° C. to 170° C. can melt the adhesive to facilitate an easier separation of the wafer 30 from the carrier plate 40. Some form of mechanical force can be applied to the wafer 30, the carrier plate 40, or some combination thereof, to achieve such separation (arrow 53 in FIG. 2P). In various implementations, achieving such a separation of the wafer with reduced likelihood of scratches and cracks on the wafer can be an important process parameter for facilitating a high yield of good dies.

Figure 2Q:
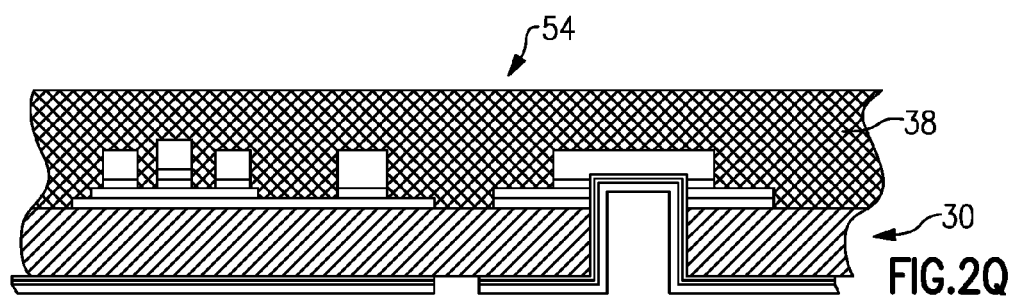

In FIGS. 2P and 2Q, the adhesive layer 38 is depicted as remaining with the wafer 30 instead of the carrier plate 40. It will be understood that some adhesive may remain with the carrier plate 40.

Figure 2R:
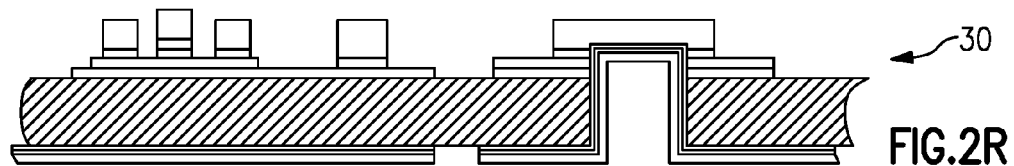

FIG. 2R shows the adhesive 38 removed from the front side of the wafer 30. The adhesive can be removed by a cleaning solution (e.g., acetone), and remaining residues can be further removed by, for example, a plasma ash (e.g., O$_2$) process.

Referring to the process 10 of FIG. 1, the debonded wafer of block 19 can be tested (block 20) in a number of ways prior to singulation. Such a post-debonding test can include, for example, resistance of the metal interconnect formed on the through-wafer via using process control parameters on the front side of the wafer. Other tests can address quality control associated with various processes, such as quality of the through-wafer via etch, seed layer deposition, and gold plating.

Figure 2S:
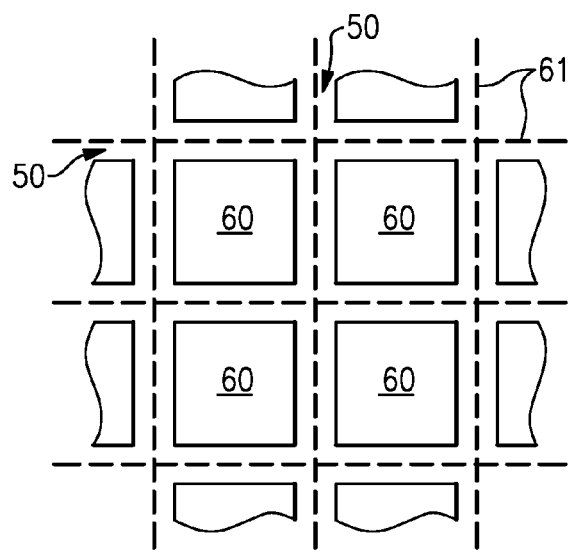

Referring to the process 10 of FIG. 1, the tested wafer can be cut to yield a number of dies (block 21). In certain implementations, at least some of the streets (50) formed in block 18 can facilitate the cutting process. FIG. 2S shows cuts 61 being made along the streets 50 so as to separate an array of dies 60 into individual dies. Such a cutting process can be achieved by, for example, a diamond scribe and roller break, saw or a laser.

Figure 2T:
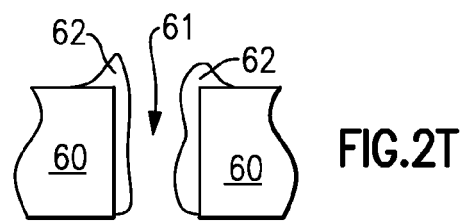

In the context of laser cutting, FIG. 2T shows an effect on the edges of adjacent dies 60 cut by a laser. As the laser makes the cut 61, a rough edge feature 62 (commonly referred to as recast) typically forms. Presence of such a recast can increase the likelihood of formation of a crack therein and propagating into the functional part of the corresponding die.

Figure 2U:
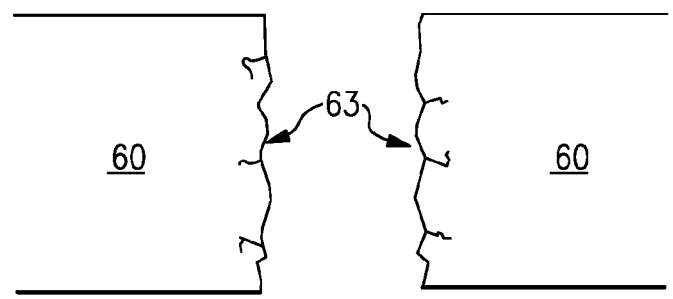
Figure 2V:
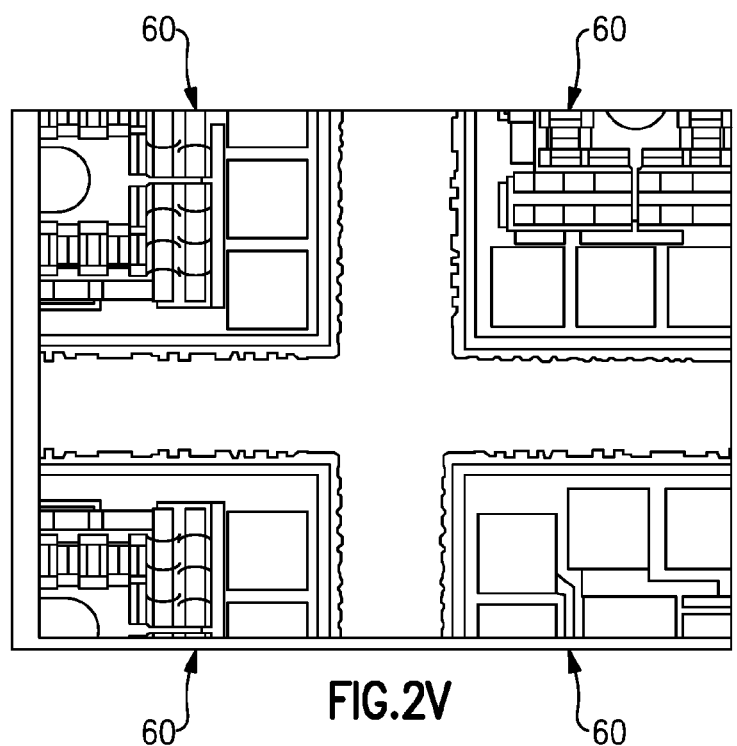

Thus, referring to the process 10 in FIG. 1, a recast etch process using acid and/or base chemistry (e.g., similar to the examples described in reference to block 15) can be performed in block 22. Such etching of the recast feature 62 and defects formed by the recast, increases the die strength and reduces the likelihood of die crack failures (FIG. 2U).

Referring to the process 10 of FIG. 1, the recast etched dies (FIG. 2V) can be further inspected and subsequently be packaged.

As described herein in reference to FIGS. 1 and 2, some operations in the process 10 can benefit from having a wafer temporarily bonded to a carrier plate. Once such operations are completed, the wafer can be removed or debonded from the carrier plate. FIGS. 3-20 show various devices and methodologies for such debonding of wafers.

It will be understood that one or more features associated with debonding devices and methodologies can be implemented in the example through-wafer via process described in reference to FIGS. 1 and 2, as well as in other processing situations. It will also be understood that one or more features associated with debonding devices and methodologies can be implemented in different types of semiconductor-based wafers, including but not limited to those formed from semiconductor materials such as groups IV, III-V, II-VI, I-VII, IV-VI, V-VI, II-V; oxides; layered semiconductors; magnetic semiconductors; organic semiconductors; charge-transfer complexes; and other semiconductors. Further, some of the features described herein can also be implemented in situations involving separation of non-semiconductor-based wafers from another structure.

Figure 3:
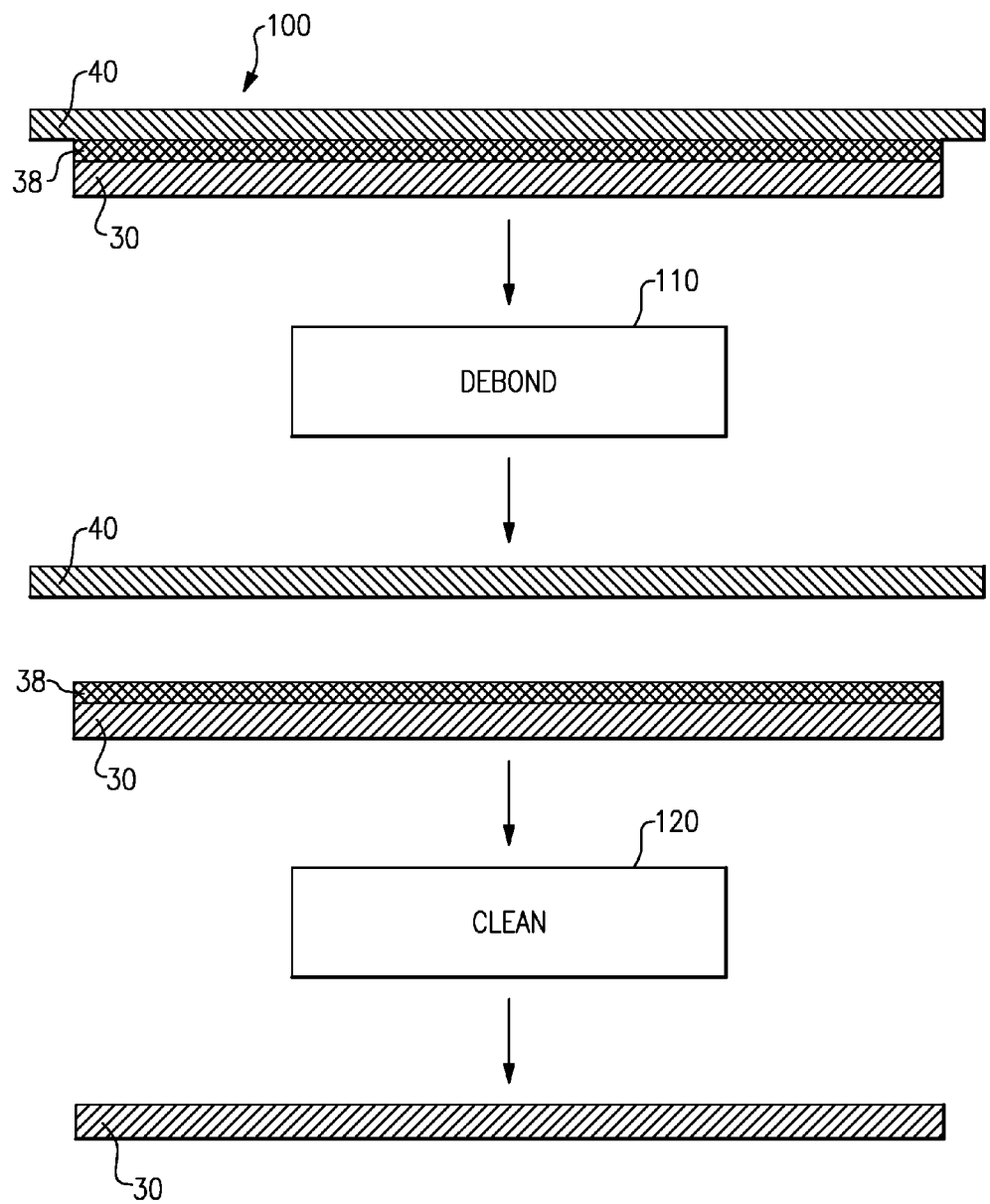
FIG. 3 shows a more detailed debonding process that can be implemented as a part of the process of FIG. 1.

FIG. 3 depicts a debonding process where a bonded assembly 100 (a wafer 30 and a carrier plate 40 bonded by an adhesive layer 38) is provided to a debonding system 110. The debonding system 110 is depicted as separating the wafer 30 and the carrier plate 40. The adhesive layer 38 may remain on the wafer 30, on the carrier plate 40, or some combination thereof.

In certain implementations, the separated wafer 30 can be subjected to a cleaning system 120 so as to yield a cleaned wafer 30. In certain implementations, the carrier plate 40 can also be cleaned for re-use.

Figure 4A:
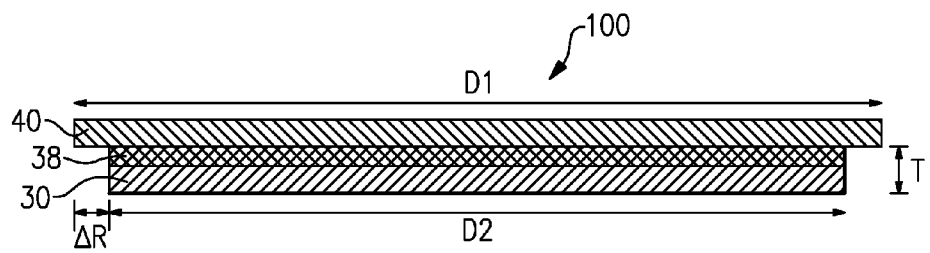
FIGS. 4A-4D show that in certain implementations, an assembly of a wafer bonded to a carrier plate can be heated so as to weaken the bond, so as to allow mechanical separation of the wafer from the carrier plate in a number of different ways.

FIG. 4A shows that in certain implementations, a carrier plate 40 can have a larger dimension (e.g., diameter D1) than that of a wafer 30 (e.g., diameter D2). Thus, when the wafer 30 is positioned appropriately relative to the carrier plate 40 (e.g., approximately centered), the carrier plate's edge extends beyond the wafer edge by an amount indicated as ΔR. In certain implementations of the present disclosure, such a configuration can be utilized to facilitate an effective separation of the wafer 30. More particularly, the carrier plate 40 itself can provide a structure facilitating the separation of the wafer. Such a feature can be advantageous over certain debonding techniques, especially when relatively thin wafers such as GaAs wafers in various sizes (e.g., 4-inch and 6-inch diameters) need to be separated from carrier plates such as sapphire plates.

For example, certain debonders can include two heated vacuum chuck assemblies—one to hold the wafer, and the other to hold the carrier plate. Upon heating of the wafer-carrier assembly, the two chucks are separated so as to pull their respective held pieces. Thus, opposing pulling forces are applied to both the wafer and the carrier plate.

Such a design can be disadvantageous in a number of ways. For example, it can be relatively costly to design, build and operated both chuck assemblies in a reliable and coordinated manner while handling and separating relatively fragile wafers. In another example, once the two chucks converge to form a vacuum grip on the wafer and the carrier plate, the view of the wafer-carrier assembly becomes obscured. Accordingly, it can be difficult to monitor, troubleshoot, and/or optimize the debonding process. In yet another example, such a debonding mechanism can sometimes result in wafer-carrier assemblies not debonding or in wafers cracking.

Referring to FIG. 4A, the distance between the inner side (wafer-bonding side) of the carrier plate 40 and the outer side (away from the carrier plate) of the wafer 30 is depicted as T. In certain implementations, such a dimension can provide one or more design parameters for debonding apparatus. Additional details concerning such design parameters are described herein.

Figure 4B:
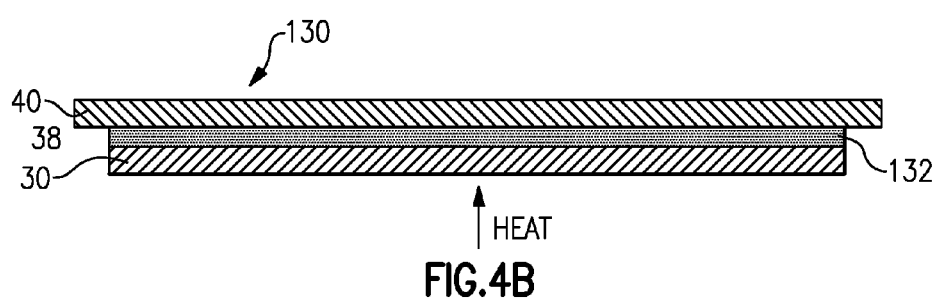

FIG. 4B shows that in certain implementations, heat can be applied to the wafer-carrier assembly so as to melt the adhesive 38, thereby yielding a more separable assembly 130 having a melted adhesive layer 132. Such heat can be provided in a number of ways. For example, the wafer-carrier assembly can be positioned on a heating surface so as to receive heat from underneath. Such a heating surface can be part of a separate heating device, or part of a debonding chuck described herein. In another example, heat can be applied from other directions (e.g., top) and/or by other methods (e.g., infrared lamp).

For the purpose of description, it will be understood that "melt," "melted," or "melting" in the context of the adhesive (38) can include situations where the adhesive is softened sufficiently to allow relatively easy separation of the wafer and carrier plate which were bonded by the adhesive. In some situations, such softening of the adhesive can occur at a temperature that is lower than the temperature where the solid-to-liquid phase transition occurs.

Figure 4C:
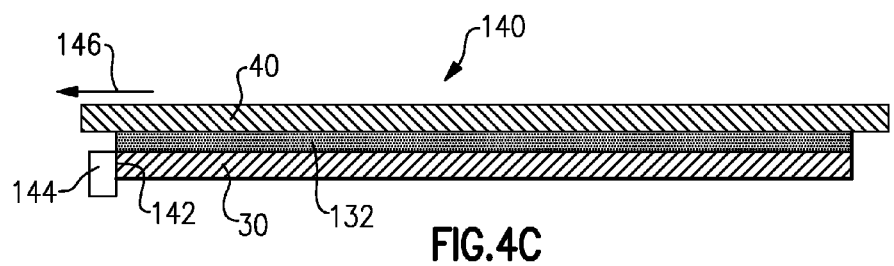

Although the adhesive is melted in FIG. 4B, at least some mechanical force needs to be applied to separate the wafer from the carrier plate due to surface tension. FIG. 4C shows that in certain implementations, such a mechanical force can be in the form of a shear force (depicted as arrow 146) applied to at least one of the wafer 30 and the carrier plate 40.

In FIG. 4C, the example shear force 146 is depicted as being applied to the carrier plate 40, while the wafer 30 is inhibited from moving in the same direction by a stop structure 144 engaging an edge 142 of the wafer 30. Examples of debonding apparatus having such features are described herein in greater detail.

While such a configuration is also possible with a carrier plate that is generally same sized (diameter) as a wafer, tolerance requirements for the stop structure 144 and positioning of the wafer-carrier assembly can be much more stringent. For example, if the stop structure is too tall relative to the carrier plate, the carrier plate's edge can also be stopped from moving.

As shown in FIG. 4C, the carrier plate having a larger lateral dimension (e.g., diameter) can provide more flexibility in the stop structure's dimensions. For example, even if the stop structure 144 is tall relative to the wafer (and adhesive layer) thickness, the stop structure 144 is inhibited from moving past the inner surface of the carrier plate 40 when the wafer's edge 142 is positioned for separation. Accordingly, the carrier plate 40 can move laterally in response to the applied shear force 146.

Figure 4D:
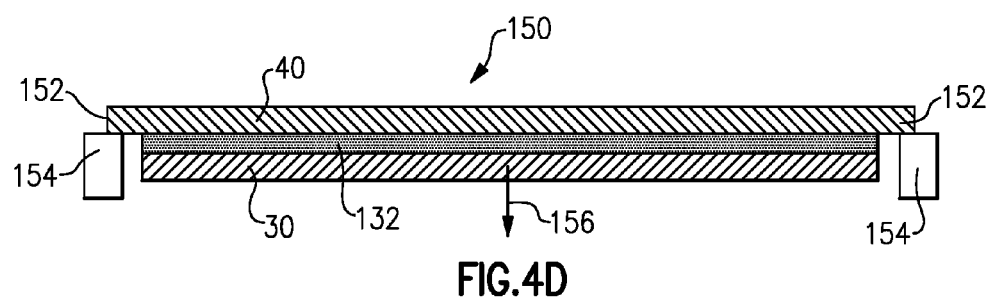

FIG. 4D shows that in certain implementations, a mechanical force for separating the wafer 30 from the carrier plate 40 can be in the form of a pulling force (arrow 156) applied to the wafer 30. Such a force can have a component that is perpendicular to a plane defined by the wafer 30. As the pulling force 156 pulls on the wafer 30, the carrier plate 40 is inhibited from moving in the same direction by one or more stop structures 154 engaging the wafer-side surface of the carrier plate 40 at the peripheral portion extending beyond the wafer's edge. Examples of debonding apparatus having such features are described herein in greater detail.

In certain implementations, the pulling force 156 can be provided by a vacuum applied from the wafer side. In other implementations, other non-vacuum-based pulling forces can also be utilized.

In the example configuration shown in FIG. 4D, the extended dimension of the carrier plate 40 (relative to the wafer dimension) allows the carrier plate 40 itself to act as a substantially stationary anchor while the wafer 30 is being pulled away. Accordingly, a carrier plate can be provided for holding a wafer to be temporarily bonded thereto, where the plate's planar dimension is larger than the wafer's planar dimension. In the context of circular wafers, circular shaped carrier plates can be provided.

In certain embodiments, such a circular carrier plate can have a diameter that is greater than the wafer's diameter by 1% or more, 2% or more, 3% or more, 4% or more, 5% or more, 6% or more, 7% or more, 8% or more, 9% or more, 10% or more, 11% or more, 12% or more, 13% or more, 14% or more, 15% or more, 16% or more, 17% or more, 18% or more, 19% or more, 20% or more, 21% or more, 22% or more, 23% or more, 24% or more, or 25% or more. Thus, for providing carrier functionality for 100-mm wafers (sometimes referred to as 4-inch wafers), a circular carrier plate can have a diameter that is approximately 101 mm or more, 102 mm or more, 103 mm or more, 104 mm or more, 105 mm or more, 106 mm or more, 107 mm or more, 108 mm or more, 109 mm or more, 110 mm or more, 111 mm or more, 112 mm or more, 113 mm or more, 114 mm or more, 115 mm or more, 116 mm or more, 117 mm or more, 118 mm or more, 119 mm or more, 120 mm or more, 121 mm or more, 122 mm or more, 123 mm or more, 124 mm or more, or 125 mm or more. For providing carrier functionality for 150-mm wafers (sometimes referred to as 6-inch wafers), a circular carrier plate can have a diameter that is approximately 151.5 mm or more, 153 mm or more, 154.5 mm or more, 156 mm or more, 157.5 mm or more, 159 mm or more, 160.5 mm or more, 162 mm or more, 163.5 mm or more, 165 mm or more, 166.5 mm or more, 168 mm or more, 169.5 mm or more, 171 mm or more, 172.5 mm or more, 174 mm or more, 175.5 mm or more, 177 mm or more, 178.5 mm or more, 180 mm or more, 181.5 mm or more, 183 mm or more, 184.5 mm or more, 186 mm or more, or 187.5 mm or more. Similarly, circular carrier plates for bonding 200-mm, 250-mm, 300-mm, and other sized wafers thereto can be dimensioned accordingly.

In certain embodiments, the foregoing carrier plates can be formed from, for example, sapphire, borosilicate (sometimes referred to as Pyrex), quartz, glass (e.g., SCG72), and other relatively rigid and chemical resistant materials. In certain embodiments, such carrier plates can be optically transparent so as allow viewing of the bonded side of the wafer.

Figure 5:
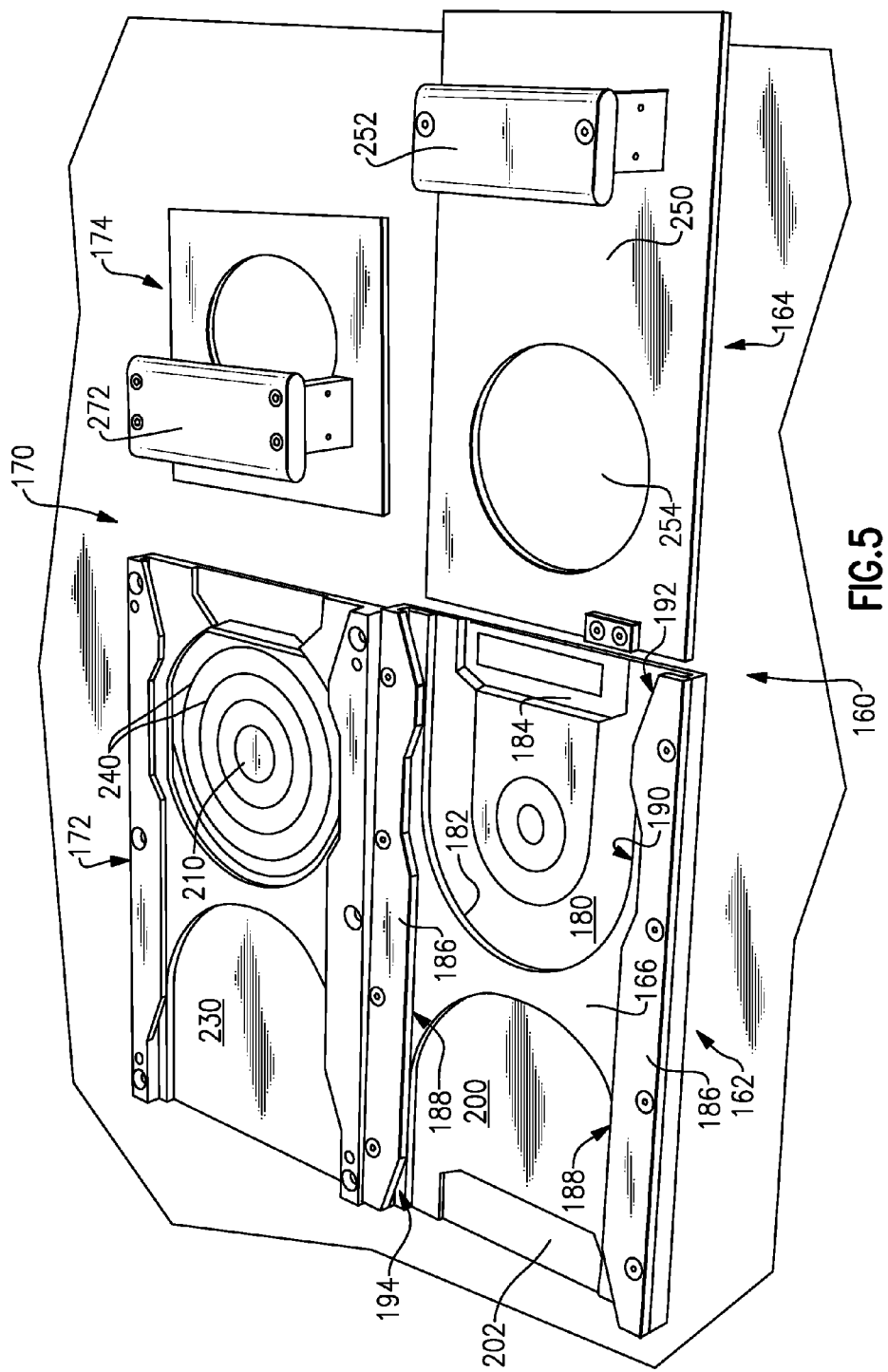
FIG. 5 shows examples of apparatus configured to separate a wafer from a carrier plate by application of shear force.
Figure 6:
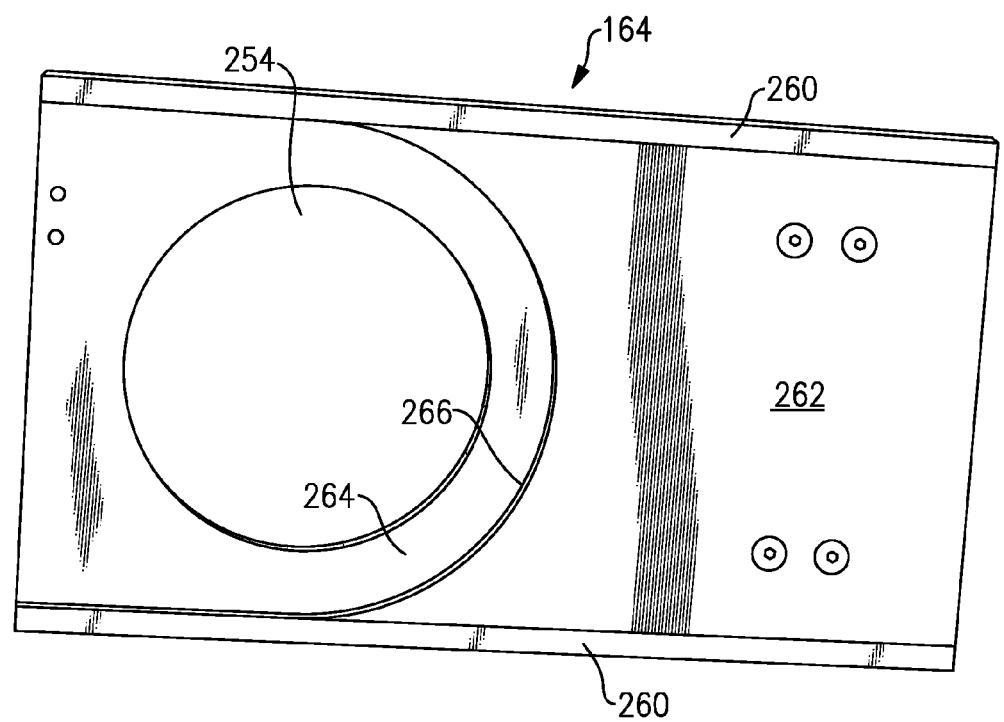
FIG. 6 shows an underside of a sliding member for the first of the example apparatus of FIG. 5.
Figure 7:
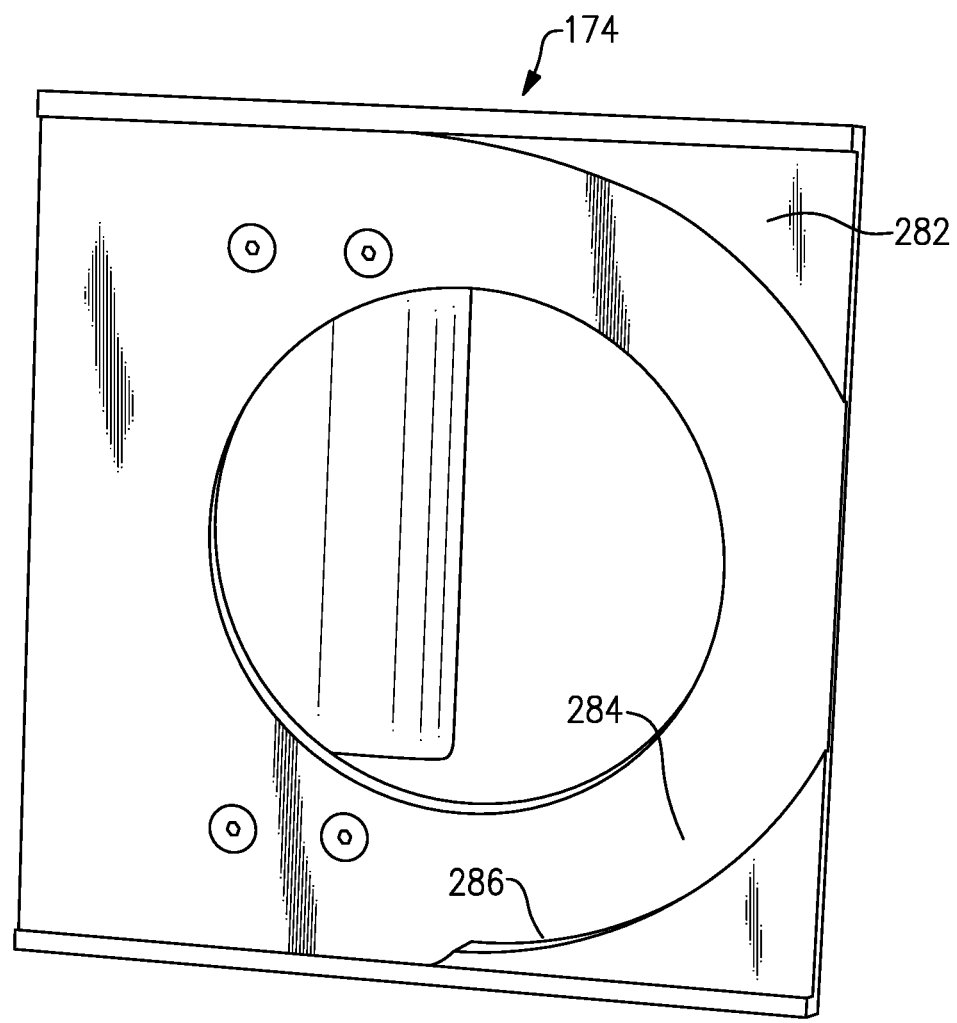
FIG. 7 shows an underside of a sliding member for the second of the example apparatus of FIG. 5.

FIGS. 5-7 show non-limiting examples of apparatus that can be configured to separate wafers from carrier plates by shear force in manners similar to the separation mode described in reference to FIG. 4C. In FIG. 5, two example debonding apparatus 160 and 170 are shown. The first apparatus 160 is depicted as having a base 162 and a sliding member 164. Similarly, the second apparatus 170 is depicted as having a base 172 and a sliding member 174.

The first base 162 can include a plate 166 that has a top surface 168, and defines first and second recesses 180, 200 on the top surface 168. The first recess 180 is at least partially defined by a wall 182 having a first height. In the example shown, the wall 182 includes a curved portion that extends approximately as a half-circle; and the radius of such a circle can be selected such that the first recess 180 can receive a wafer to be separated. The first height of the wall 182 can depend on whether the radius of the first recess 180 accommodates the wafer but not the corresponding over-sized carrier plate, or both the wafer and the carrier plate (wafer-sized or over-sized). For the former case, the first height of the wall 182 can be greater than the thickness of the wafer due to the over-sized carrier plate as explained in reference to FIG. 4C. For the latter case, the first height of the wall 182 can be selected to be less than the distance between the bottom (unbonded) surface of the wafer to the bonded surface of the carrier plate.

To separate the wafer from its carrier plate, the wafer-carrier assembly is positioned on the first recess 180 so that the wafer is on the bottom. Such a wafer-carrier assembly can be heated prior to such positioning so as to soften the adhesive for easier separation. Alternatively, the recess 180 can be configured to provide heat when the wafer-carrier assembly is positioned thereon. Such a heating functionality can be achieved by, for example, providing a hotplate that defines the bottom of the recess 180, or by having the bottom of the recess be in thermal contact with a heat source.

Referring to FIG. 5 and FIG. 6 (showing an underside 262 of the first sliding member 164), the first base 162 is depicted as having sides 186 that define guide slots 188 dimensioned to receive and guide the side edges 260 of the sliding member 164. In certain embodiments, the guide slots 188 can be dimensioned to guide the sliding member 164 along a direction that is substantially parallel to a plane defined by the wafer-carrier assembly positioned on the first recess 180.

In certain embodiments, the portion of the sliding member 164 that engages and pushes the edge of the carrier plate is positioned and dimensioned to make such an engagement but does not engage the wafer. As shown in FIG. 6, such a carrier plate-engaging portion of the sliding member 164 can be provided by a wall 266 of a recess 264 formed on the underside 262. The recess 264 and its wall 266 can be dimensioned to receive the carrier plate when the side edges 260 are positioned in the guide slots 188, but not the wafer.

Upon such positioning of the sliding member 164 on the wafer-carrier assembly, the sliding member 164 can be pushed (e.g., towards the left in FIG. 5) to provide a shear force to the lagging edge of the carrier plate. Since the leading edge of the wafer is inhibited from moving by the wall 182 of the first recess 180, the carrier plate slides away from the wafer by the guided motion of the sliding member 164. In certain embodiments, a handle 252 can be provided on the upper side of the sliding member 164 to facilitate application of the shear force.

In certain embodiments, the sliding member 164 can be provided with an opening 254 to allow viewing of the carrier plate during the separation process. In embodiments where the carrier plate is optically transparent, the wafer can also be viewed through the opening 254.

Referring to FIG. 5, the second recess 200 formed on the top surface 168 can be dimensioned to receive the carrier plate that has been separated by the sliding motion of the sliding member 164. In certain embodiments, the second recess 200 is sufficiently dimensioned in lateral dimension and depth so as to allow the carrier plate to readily fall therein and become clear of the underside 262 of the sliding member 164.

In certain embodiments, the first base 162 can include a number of features that can facilitate various operations during the debonding process. For example, cutouts 190 can be provided along the sides 186 so as to facilitate positioning of the wafer-carrier assembly onto the recess 180, and to facilitate removal of the separated wafer from the recess 180. In another example, to accommodate a wafer handling tool (not shown) during such removal, a deeper recess 184 can be formed at the edge of the first recess 180 so as to allow handling of the wafer via its bottom (unbonded) surface (e.g., using a vacuum wand). Similarly, a deeper recess 202 can be formed at the edge of the second recess 200 so as to allow easier removal of the carrier plate. In yet another example, the ends 192, 194 of the sides 186 that define the guide slots 188 can be rounded or angled so as to allow easier insertion of the sliding member 164 into the guide slots 188.

Referring to FIG. 5, the base 172 of the second debonding apparatus 170 is depicted as having first and second recesses 210, 230, and guide slots 218 for receiving and guiding the sliding member 174. Various dimensions and functionalities provided by such features can be similar to those described in reference to the first example debonding apparatus 160.

In certain embodiments, however, the first recess 210 of the base 172 can be configured to provide suction to the wafer when the wafer-carrier assembly is positioned thereon. Such suction can be facilitated by features 220 such as grooves and/or holes formed at the bottom surface of the recess 210, where such features are in communication with a vacuum system (not shown). In the example shown, the features 210 include a number of concentric circular grooves that can facilitate distributing of the suction force on the wafer.

Holding of the wafer in such a manner provides an additional resistance against lateral movement of the wafer during the sliding separation of the carrier plate. In certain embodiment, the depth of the recess 210 can be selected so that when the wafer is vacuum-held in the recess 210, the bonded side of the carrier plate is above the top of the recess 210 so as to allow the carrier plate to slide upon application of a shear force by the sliding member 174.

FIGS. 5 and 7 show that in certain embodiments, the sliding member 174 can include some features that are different than the sliding member 164 of the first debonding apparatus 160. For example, the length of the second sliding member 174 is considerably shorter than that of the first sliding member 164. To accommodate such a shorter length, a handle 272 can be positioned forward of a carrier plate-engaging feature of the sliding member 174. In FIG. 7, such a carrier plate-engaging feature is depicted as being provided by a wall 286 of a recess 284 formed on the underside 282 of the sliding member 174.

Figure 8:
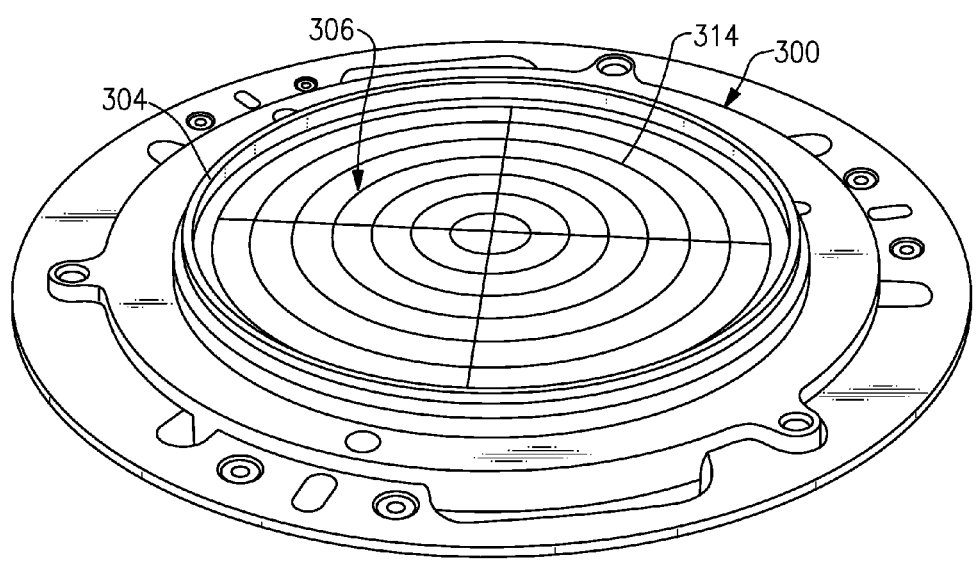
FIG. 8 shows a perspective view of a debonding chuck configured to allow separation of a wafer from a carrier plate by application of vacuum.
Figure 9A:
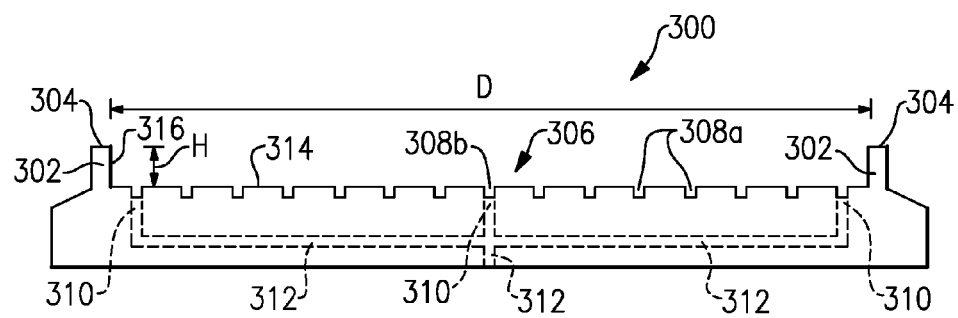
FIGS. 9A and 9B show side sectional and plan views of the debonding chuck of FIG. 8.
Figure 9B:
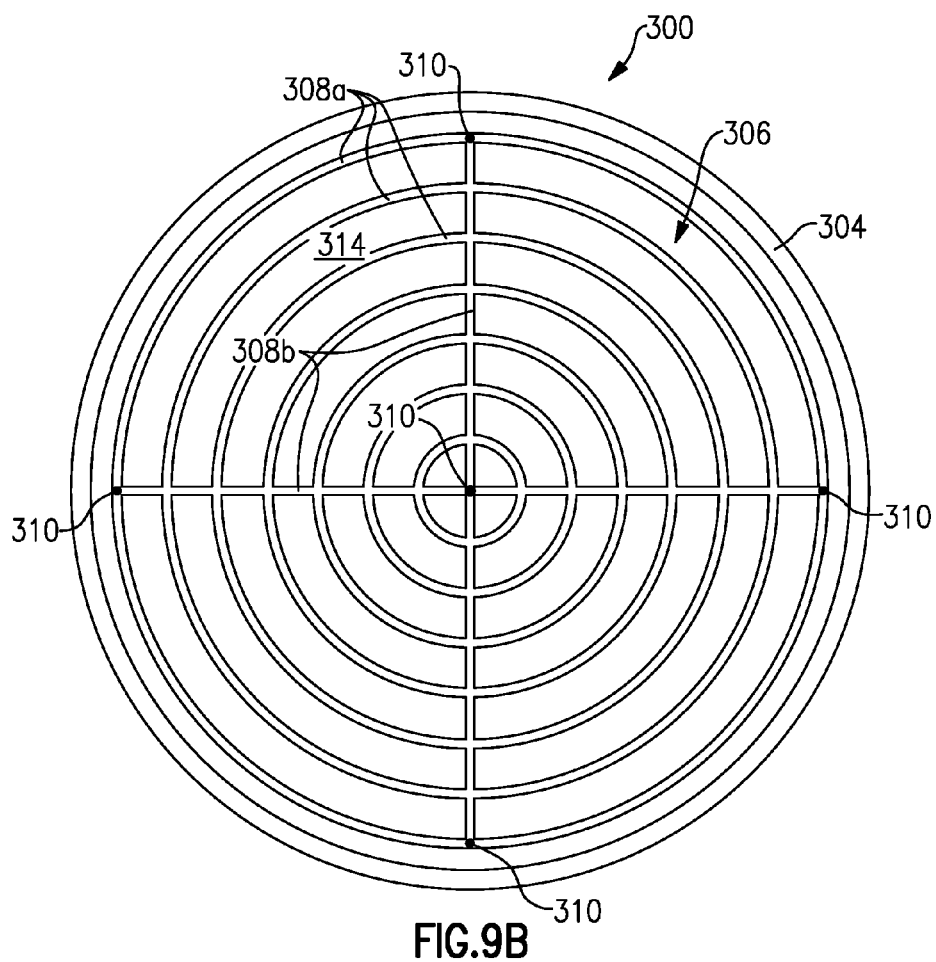

FIGS. 8-10 show examples of an apparatus that can be configured to separate wafers from carrier plates by a pulling force applied to a wafer in manners similar to the separation mode described in reference to FIG. 4D. FIG. 8 shows a perspective view of an example debonding chuck 300 that can be configured to provide such wafer-separating functionality. FIGS. 9A and 9B show sectional side view and plan view, respectively, of the debonding chuck 300. FIGS. 10A-10E show an example sequence of a wafer being separated from a carrier plate.

The example debonding chuck 300 is described herein in the context of separating a circular wafer from a circular carrier plate. It will be understood, however, that one or more features or concepts described herein can also be implemented in other shaped wafers and carrier plates. Further, such features and concepts can also be implemented in other situations not necessarily involving semiconductor wafers.

In certain implementations, a wafer-carrier assembly to be separated can be lowered onto the debonding chuck with the wafer on the lower side. Accordingly, the debonding chuck 300 can define a recess 306 (with a diameter D) having a floor surface 314 and a side wall 316 (with a height H). The recess 306 is depicted as being formed relative to an upper surface 304.

In certain embodiments, the diameter D of the recess 306 can be selected to allow the recess 306 to receive the wafer but not the oversized carrier plate. The upper surface 304 can be dimensioned to allow the peripheral portion of the lower surface of the carrier plate not covered by the wafer to be supported thereon when the wafer is in the recess 306.

In certain embodiments, the height H of the side wall 316 can be selected to allow the recess 306 to receive the wafer that is yet unseparated from the carrier plate and to provide space between the bottom (unbonded) side of the wafer and the floor surface 314 of the recess 306. The vertical dimension of such a space can be selected such that the wafer, once separated and resting on the floor surface 316, is sufficiently separated from the carrier plate to allow easy removal of the carrier plate. The vertical dimension of the space can also be selected to limit deformations (e.g., flexing) of the wafer as the wafer is being pulled away from the carrier plate. An example of such wafer-flexing is described in greater detail in reference to FIG. 10.

In certain implementations, at least some of the foregoing design criteria can be addressed by a recess diameter D that is greater than the diameter of a wafer but less than the diameter of a carrier plate. For the wafer-plate example where the wafer's diameter is approximately 100 mm and the carrier plate's diameter is approximately 110 mm, the recess diameter D can be in a range of about 101 mm to 108 mm, about 101 mm to 106 mm, or about 101 mm to 104 mm. In certain embodiments, the recess diameter D can be approximately 102 mm for the foregoing example.

For the wafer-plate example where the wafer's diameter is approximately 150 mm and the carrier plate's diameter is approximately 160 mm, the recess diameter D can be in a range of about 151 mm to 158 mm, about 151 mm to 156 mm, or about 151 mm to 155 mm. In certain embodiments, the recess diameter D can be approximately 152 mm for the foregoing example.

In certain implementations, at least some foregoing design criteria can be addressed by a recess depth H that is greater than the thickness of a wafer. In certain embodiments, the depth H can be selected to be greater than the wafer thickness and less than about five times the wafer thickness, about four times the wafer thickness, about three times the wafer thickness, or about two times the wafer thickness.

For the wafer-plate example where the wafer's thickness is approximately 100 μm, the recess depth H can be selected to be greater than the thickness by an amount in a range of about 0.001" to 0.002" (approximately 25 μm to 50 μm). Thus, in certain embodiments, a recess depth H of about 140 μm can be utilized.

In the example shown, the recess 306 is depicted as generally having a cylindrical shape with the side wall 316 being generally perpendicular to the floor surface 314. It will be understood, however, that such a recess shape is not a requirement. For example, the side wall 316 can be angled away from the perpendicular orientation, and yet allow the separated wafer to engage the floor surface 314 while the carrier plate remains supported by the upper surface 304.

Referring to FIGS. 8 and 9, the floor surface 314 of the recess 306 can define one or more features for applying suction to the recess 306 such that the suction can pull the wafer away from the carrier plate. The oversized carrier plate itself, being positioned above the recess 306 and supported by the upper surface 304, acts as a relatively rigid and stationary anchor that facilitates the suction-induced movement of the wafer towards the floor surface 314. Accordingly, the wafer becomes separated from the carrier plate.

In certain embodiments, the suction provided to the recess 306 can be distributed along the floor surface 314 so as to reduce likelihood of a highly localized suction that can damage a wafer. In the example shown in FIGS. 8 and 9, a number of grooves 308 formed on the floor surface 314 are shown to be in communication with a number of holes 310 that are in turn in communication with a vacuum device such as a pump (not shown) through vacuum pathways 312. The example grooves 308 are depicted as including a number of concentric grooves 308a and a number of radially extending grooves 308b. The example holes 310 are depicted as being positioned approximately at the center and at about 90 degrees along the outer circumference of the outer circular groove 308a. In such a configuration, suction formed at the holes 310 can be distributed along the floor surface 314 of the recess 306.

It will be understood that a number of different configurations of holes, grooves, and/or other features can be provided to distribute the suction in the recess. For example, a floor surface can have a number of holes (and no grooves) arranged in a desired pattern along the floor surface. In another example, a number of grooves can be formed so as to be in communication with one or more vacuum pathways that are not necessarily below the floor surface. In yet another example, a number of grooves does not necessarily need to include both the concentric type and the radially extending type. In yet another example, the grooves need not even be symmetric. A number of other configurations are possible.

It will also be understood that, although the recess portion and the portion having the vacuum pathways are depicted as being part of a single piece, such depiction is for illustrative purpose. Such a structure having the recess portion and the vacuum pathways can be implemented by one or more pieces in a number of ways.

In certain embodiments, for example, a debonding chuck can include a bottom plate that defines the floor surface and the grooves and holes, but not the vacuum pathways. Such a bonding chuck can then be installed on a platform so as to allow suction communication between the holes and one or more vacuum pathways.

In certain embodiments, a debonding chuck having one or more of the foregoing features can be fabricated from metal or other resilient materials. For example, a debonding chuck can be fabricated from metal such as aluminum which is relatively easy to machine. Features associated with the example shown in FIGS. 8 and 9 are relatively simple for the purpose of machining, thereby further facilitating efficient fabrication.

In certain embodiments, a debonding chuck can act as a hotplate or be in thermal communication with a heat source so as to allow heating of a wafer-carrier assembly positioned thereon. For such embodiments, materials such as aluminum can be appropriate. In other embodiments, a debonding chuck does not have a heating capability; thus, a wafer-carrier assembly can be heated prior to being positioned on the chuck.

Figure 10A:
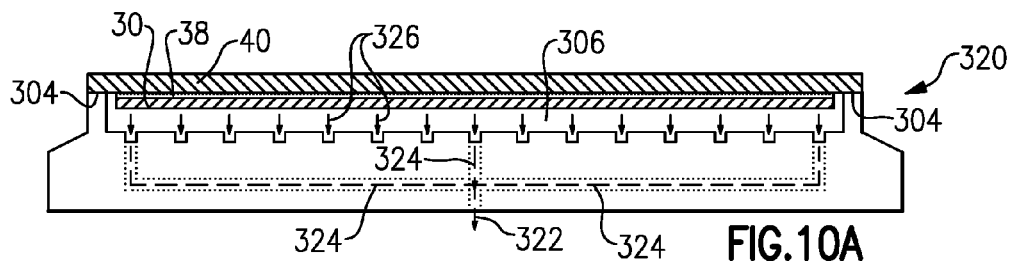
FIGS. 10A-10E show an example sequence of the wafer being separated from the carrier plate by the debonding chuck of FIG. 8.

FIGS. 10A-10E shows an example wafer separation sequence that can be achieved using the wafer chuck 300 described in reference to FIGS. 8 and 9. FIG. 10A shows a stage 320 where suction (arrows 326) is being applied to a wafer-carrier assembly (a wafer 30 and a carrier plate 40 with a softened adhesive layer 38 therebetween) placed on the recess 306, so that the wafer 30 is in the recess 306 and the carrier plate 40 is supported by the upper surface 304. The suction in the recess 306 is depicted as being in communication (dashed lines 324 and arrow 322) with a vacuum device (not shown).

Figure 10B:
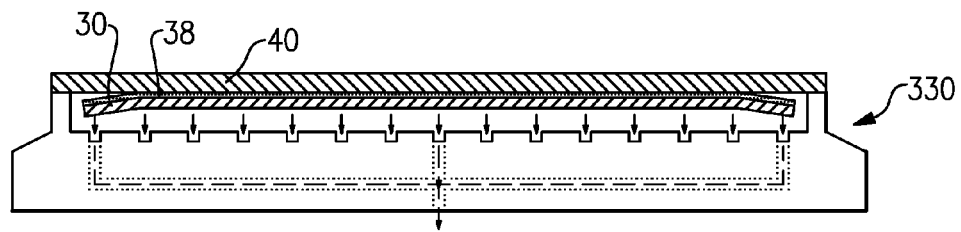

FIG. 10B shows a stage 330 where the edge portion of the wafer 30 is depicted as being separated from the carrier plate 40 due to the suction. In debond chuck configurations where the suction is distributed along the floor surface of the recess, such initial separation of the edge is likely due to the surface tension (provided by the melted adhesive) ending at the edge. Thus, the edge portion generally has a lower surface tension per area than at inward areas.

Figure 10C:
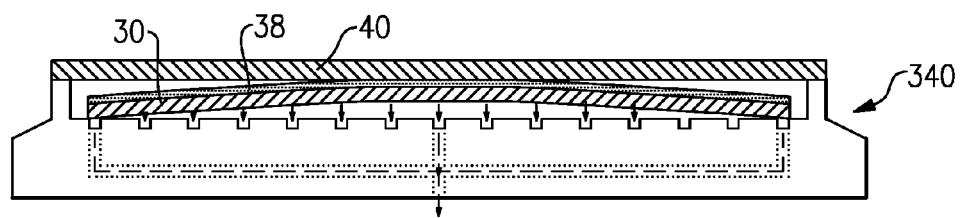

FIG. 10C shows a stage 340 where the wafer separation continues inward. In FIG. 10C, the edge of the wafer 30 is depicted as having reached and engaging the floor surface of the recess 306.

Figure 10D:
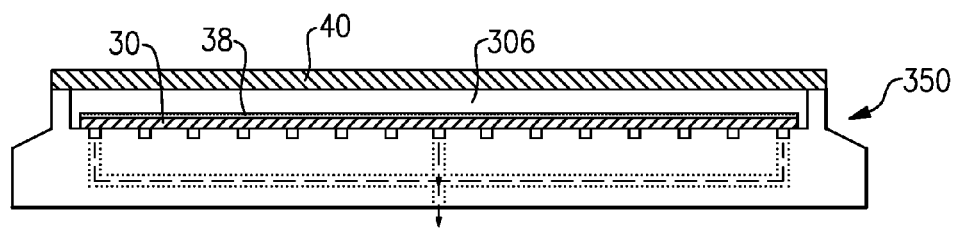

FIG. 10D shows a stage 350 where the wafer 30 has been separated from the carrier plate 40 and is resting on the floor surface of the recess 306. Once such a stage is reached, the suction can be stopped.

Figure 10E:
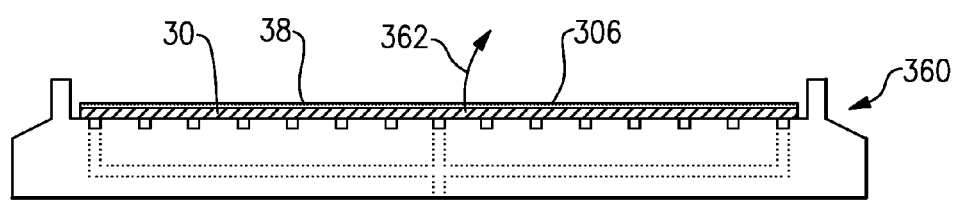

FIG. 10E shows a stage 360 where the suction has stopped and the carrier plate removed. Accordingly, the separated wafer 30 with at least some of the adhesive 38 remaining thereon can be removed (arrow 362) for cleaning. Such removal of the wafer 30 can be achieved in a number of ways, depending on whether the debonding chuck is part of a manual system or an automated system.

Figure 11A:
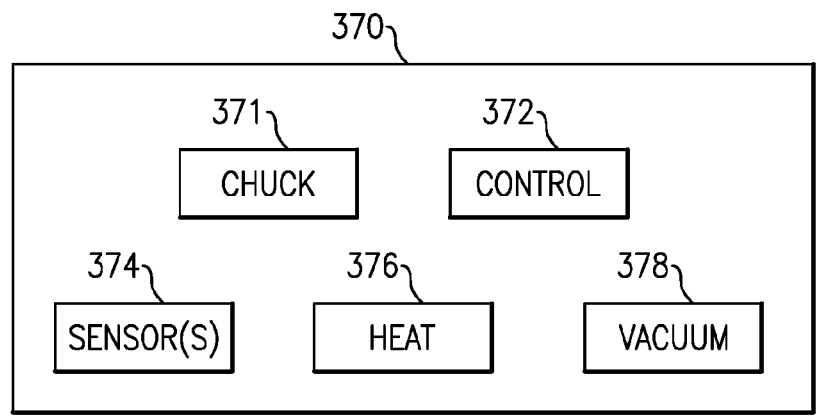
FIGS. 11A-11C show that in certain implementations, a system having a vacuum-based debonding apparatus can be configured to include a sensor component and/or a vacuum control component so as to facilitate certain debonding operations such as application and termination of vacuum.

FIGS. 11 and 12 show non-limiting examples of ways in which one or more features associated with the debonding chuck described in reference to FIGS. 8-10 can be implemented in systems, and how such features can be modified to provide desired functionalities. FIG. 11A shows an example debonding system 370 having a debonding chuck component 371. Such a chuck can include some or all of the features described herein in reference to FIGS. 8-11.

In certain implementations, the system 370 can further include one or more sensors (component 374) that are configured to sense one or more operating conditions of the system 370. For example, the system 370 can include a heating component 376 configured to heat the wafer-carrier assembly so as to melt the adhesive layer. For such a component, a temperature sensor can be provided so as to monitor the temperature of the wafer-carrier assembly. In another example, the system can include a vacuum component 378 configured to provide the suction to the recess of the debonding chuck. For such a component, a pressure sensor can be provided so as to monitor the pressure associated with the suction being provided to the recess.

In certain implementations, the system 370 can further include a control component 372 configured to control one or more operations associated with the debonding process. In automated systems, the control component 372 can be configured to coordinate various operations, such as loading of the wafer-carrier assembly on the chuck, heating the wafer-carrier assembly, separating the wafer from the carrier plate, removing the carrier plate, removing the wafer from the chuck, and other related operations.

Figure 11B:
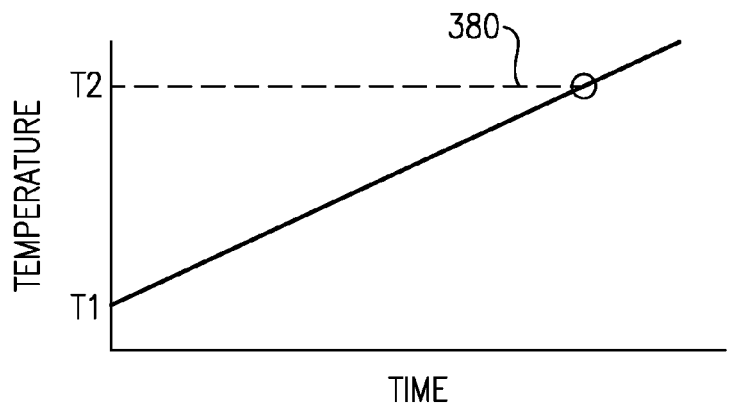

FIG. 11B shows an example of how the control component 372 can control the operation of the heating component 376. For the purpose of description, it will be assumed that heating occurs via the debonding chuck, and that when a new wafer-carrier assembly is loaded on the chuck, the assembly's temperature is lower than the target temperature where the adhesive layer melts.

Thus, in FIG. 11B, the temperature of the wafer-carrier assembly is depicted as increasing as heat is applied. Such temperature measurements can be provided by the sensor component 374, and can be achieved in a number of ways. For example, the wafer-carrier assembly's temperature can be estimated based on the measured temperature of the hotplate, taking into account time needed for the wafer-carrier assembly reach equilibrium with the hotplate. In another example, an external temperature probe positioned above the wafer-carrier assembly can take temperature measurements in a number of different ways.

When a target temperature T2 is reached, the control component 372 can issue a signal to stop further heating, and to initiate the wafer separation process. Such a separation process can include the vacuum component providing suction to the recess. At such a stage, pressure in the recess can begin an initial value and decrease as suction is applied.

Figure 11C:
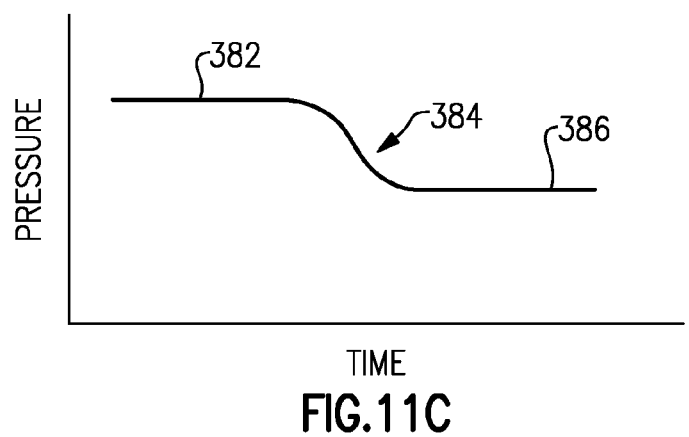

FIG. 11C shows an example pressure profile as the separation process progresses. Such pressure measurements can be provided by the sensor component 374 and be achieved in a number of know ways.

As suction is applied to the recess and the wafer is being pulled at, the associated pressure is depicted as being at or about a level indicated as 382. As the wafer is separated and displacing the lower portion of the recess, the associated pressure is depicted as changing (384) so as to reach a new level indicated as 386. During such a pressure change (e.g., drop in pressure) can be detected, and an appropriate command can be issued by the control component 372 so as to stop the suction.

As described herein, a number of features such as grooves and/or holes can be provided to the floor surface of the recess so as to distribute the suction's pulling force applied to the wafer. Such distribution and magnitudes of the distributed pulling forces can be adjusted by the size, density, and pattern of such features, as well as the strength of the overall suction being provided.

The suction strength as applied to the wafer can also be influenced by how well the carrier plate engages with the upper surface of the debonding chuck and "seals" the recess. For example, the upper surface 304 shown in FIG. 9B can extend around the recess 306. Thus, a tight contact between the carrier plate and the upper surface 304 can result in the recess 306 being evacuated relatively quickly, even if the suction strength can be controlled.

Similarly, the suction strength as applied to the separated wafer can also be influenced by how well the wafer engages with the floor surface of the recess and "seals" the recess from the vacuum pathways. In the example shown in FIGS. 9B and 10D, the wafer 30 can cover substantially all of the grooves and holes on the floor surface 314. Thus, a tight contact between the wafer and the floor surface 314 can result in the pressure differential increasing sharply between the regions above and below the wafer.

In certain implementations, such good "seals" may not be desirable, since they can increase the likelihood of damage to the wafer-carrier assembly (before separation) and the wafer (after separation). Thus, in certain embodiments, one or more portions of the recess 306 can be open to the outside by, for example, one or more openings on the side wall. Such opening(s) on the side wall can be dimensioned to limit the pressure differential between the regions above (outside) and below (recess 306) the wafer-carrier assembly. Such opening(s) can also facilitate loading of the wafer-carrier assembly, and removal of the carrier plate after separation in certain implementations.

Similarly, in certain embodiments, at least some of the suction-distributing features (such as grooves) can be exposed to the outside. Such an exposure of the grooves can be configured to limit the pressure differential between the regions above (recess 360) and below (grooves 308) the wafer. Such opening(s) can also facilitate removal of the separated wafer in certain implementations.

Figure 12A:
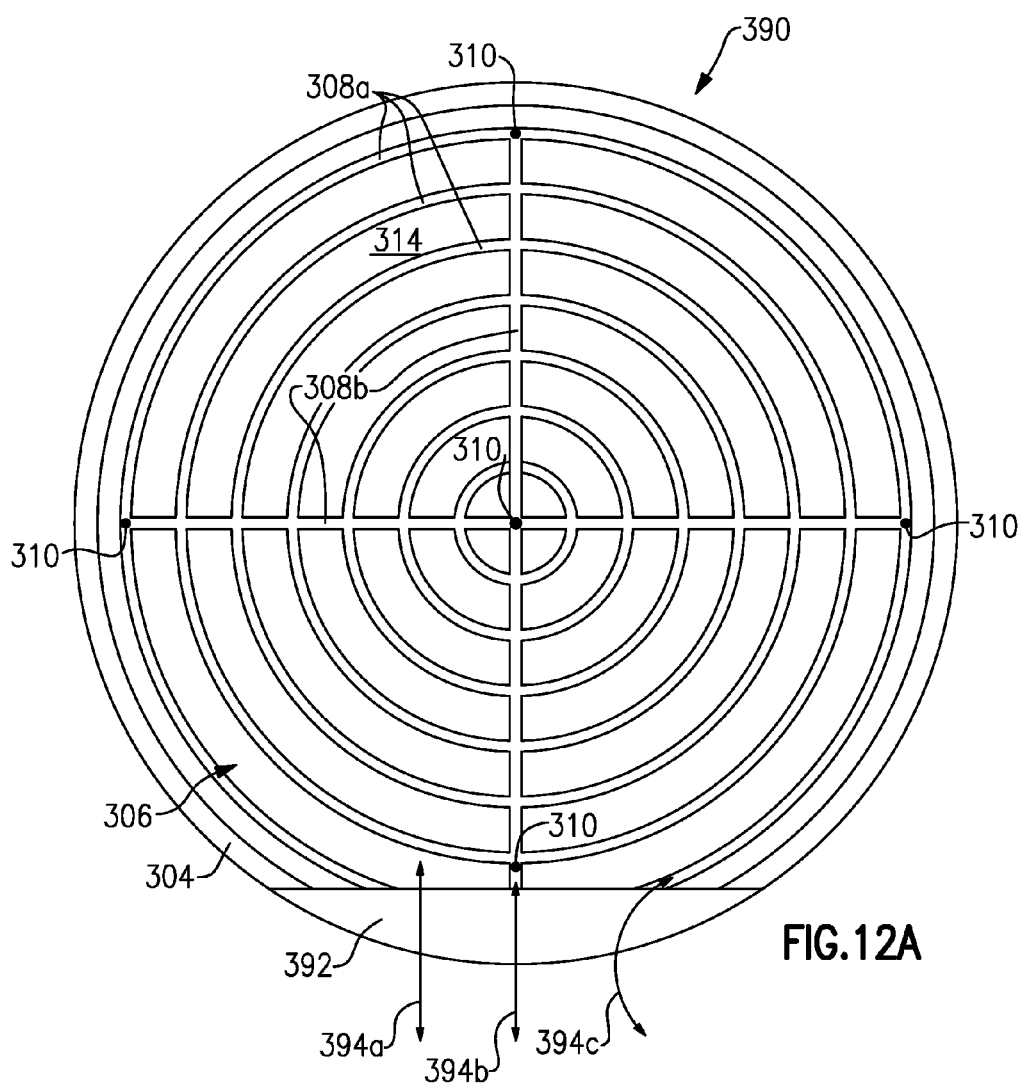
FIGS. 12A and 12B show that in certain embodiments, a debonding chuck can be configured so that at least some portion of its recess and/or suction distributing grooves can be in communication with the outside so as to limit pressure differentials.
Figure 12B:
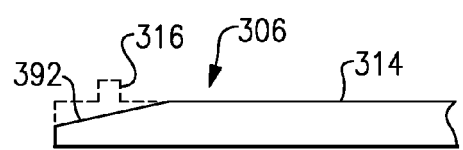

FIGS. 12A and 12B show an example debonding chuck 390 configured to provide both of the foregoing pressure relief features. The chuck 390 is generally similar to the example chuck 300 described in reference to FIGS. 8 and 9. However, the chuck 390 is depicted as having an angled surface 392 on one portion of the perimeter. The angled surface 392 can be dimensioned to cut through a portion of the side wall (the cut portion depicted as dotted side wall 316 in FIG. 12B), and through a portion of the peripheral portions of the grooves 308a, 308b.

Accordingly, the angled surface 392 allows provides at least some pressure communication between the outside and the recess 306 (indicated as arrow 394a) and between the outside and the grooves 308a, 308b (indicated as arrows 394c, 394b). In certain embodiments, more than one of such pressure relief opening sets can be provided. In certain embodiments, openings for the vacuum pathways and the recess can be provided separately at different locations.

Figure 13A:
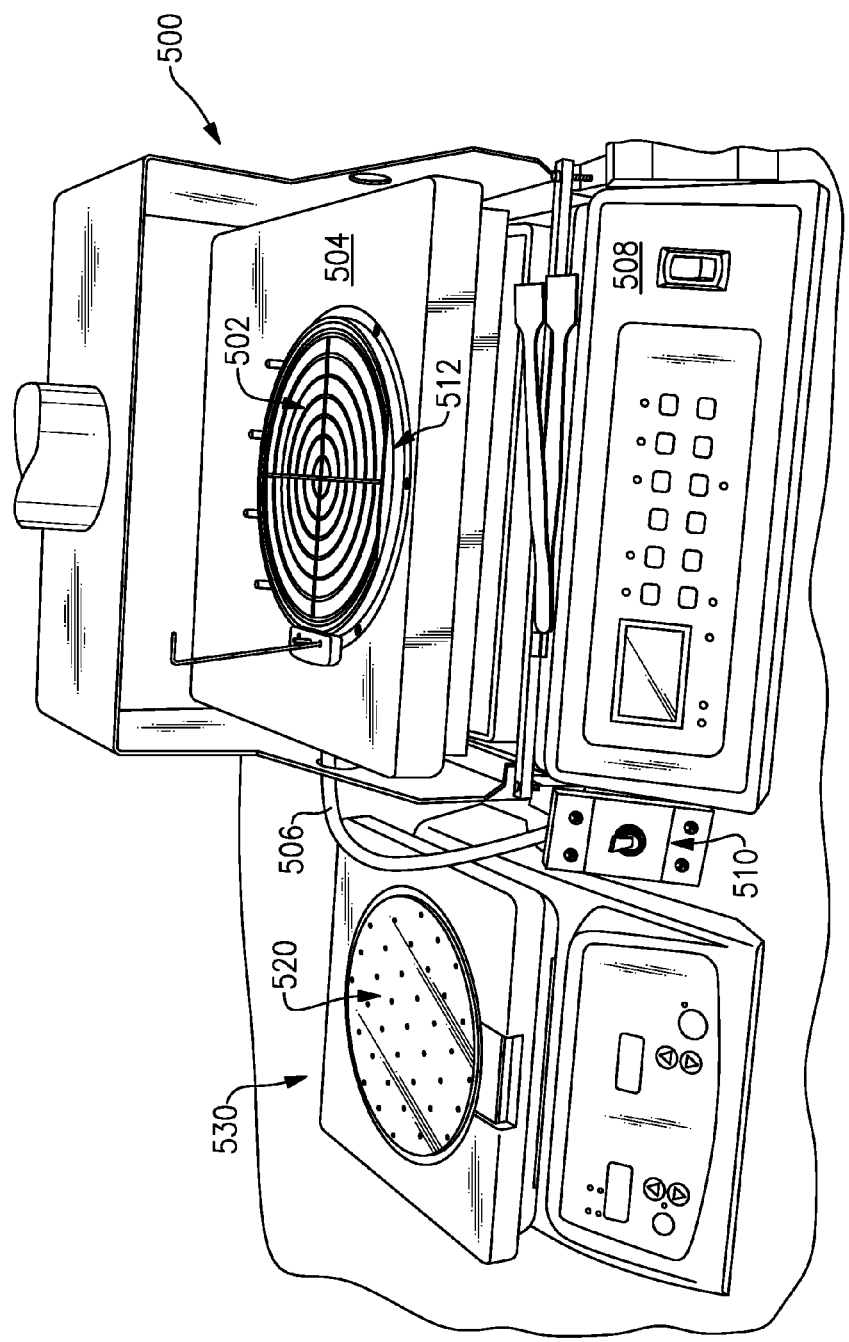
FIG. 13A shows that in certain embodiments, the debonding chuck of FIG. 8 can be implemented in a manual debonding system that can include a heater (on which a wafer-carrier assembly is being heated) and a debonding apparatus.
Figure 13B:
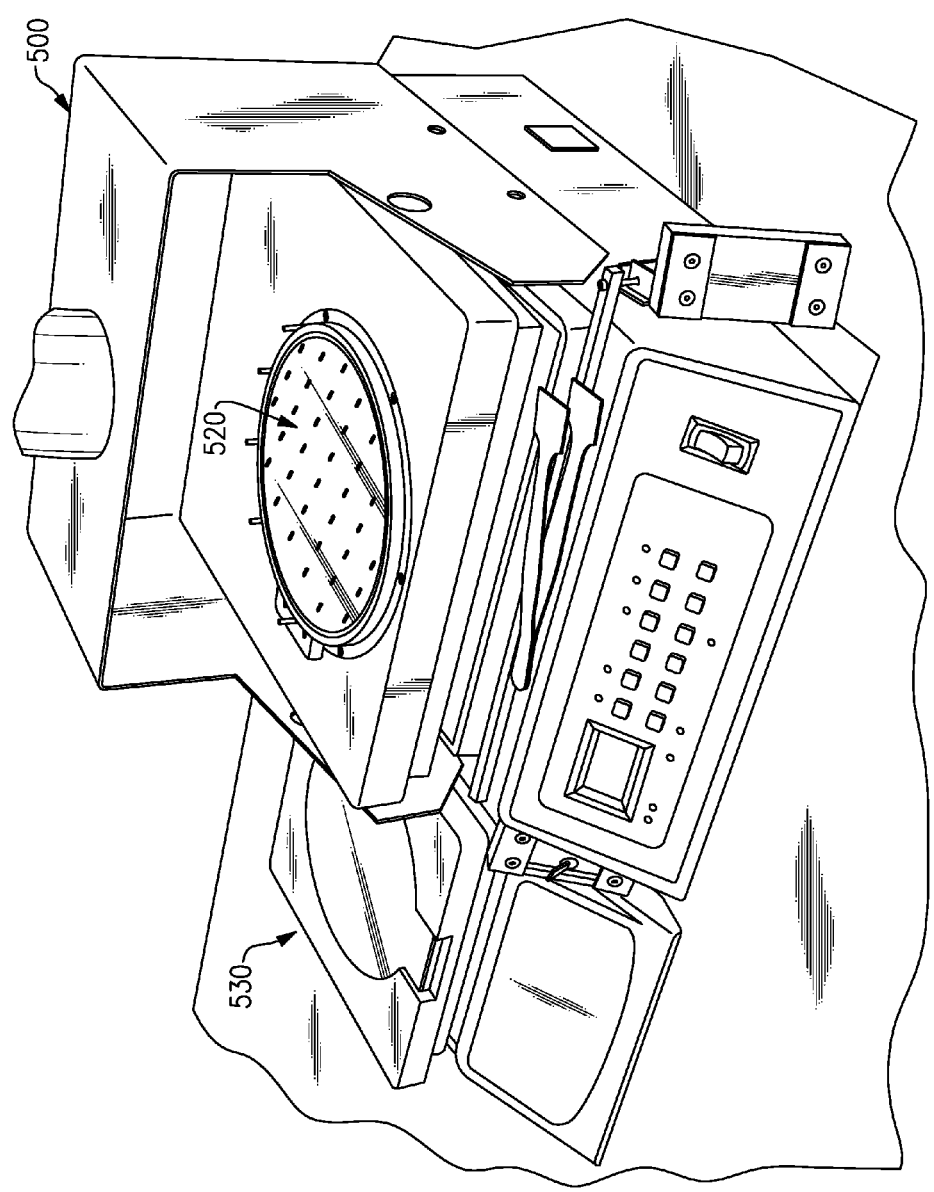
FIG. 13B shows the heated wafer-carrier assembly on the debonding apparatus for mechanical separation.
Figure 15A:
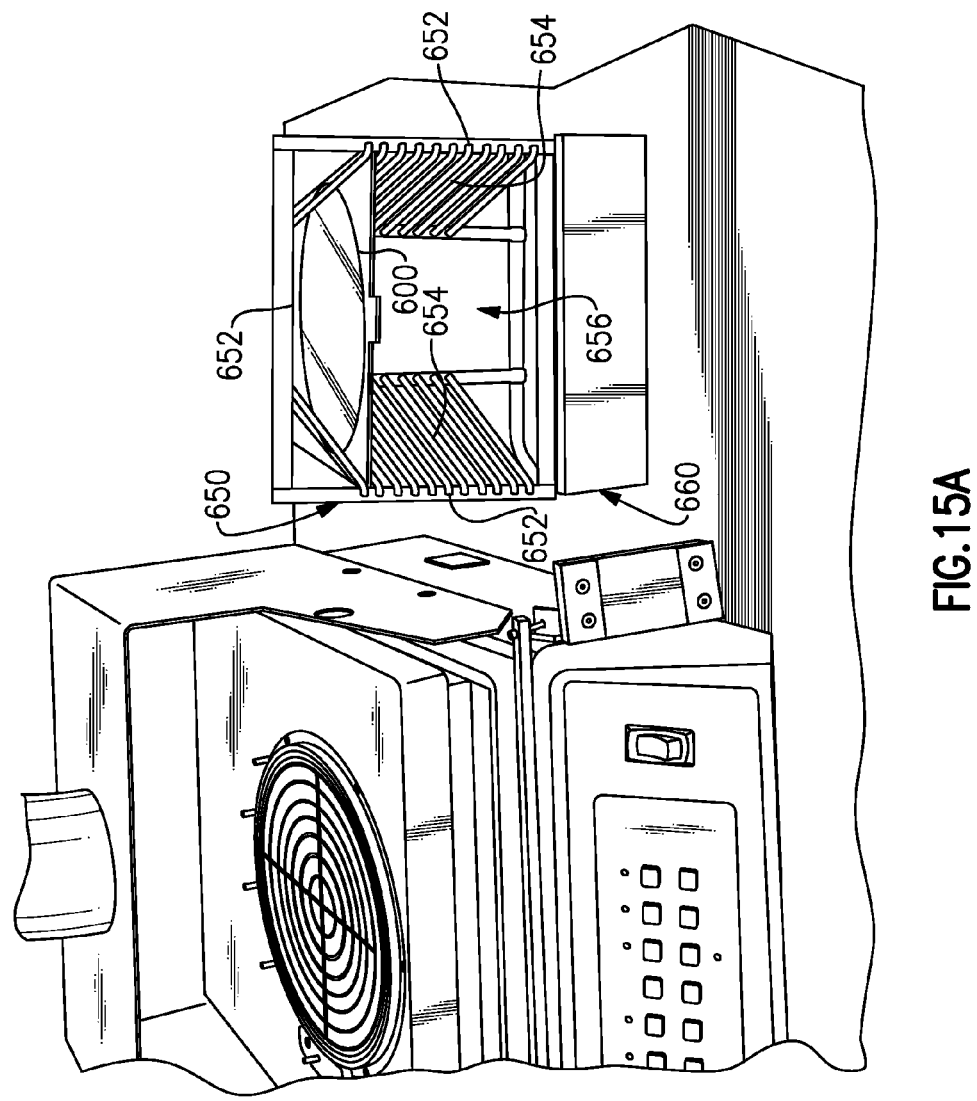
FIG. 15A shows that in certain implementations, a first cassette device can be configured to hold a number of the wafer holders of FIGS. 14A and 1B, such that in its first orientation, the cassette device facilitates collection of separated wafers from the manual debonding system of FIGS. 13A and 13B.
Figure 15B:
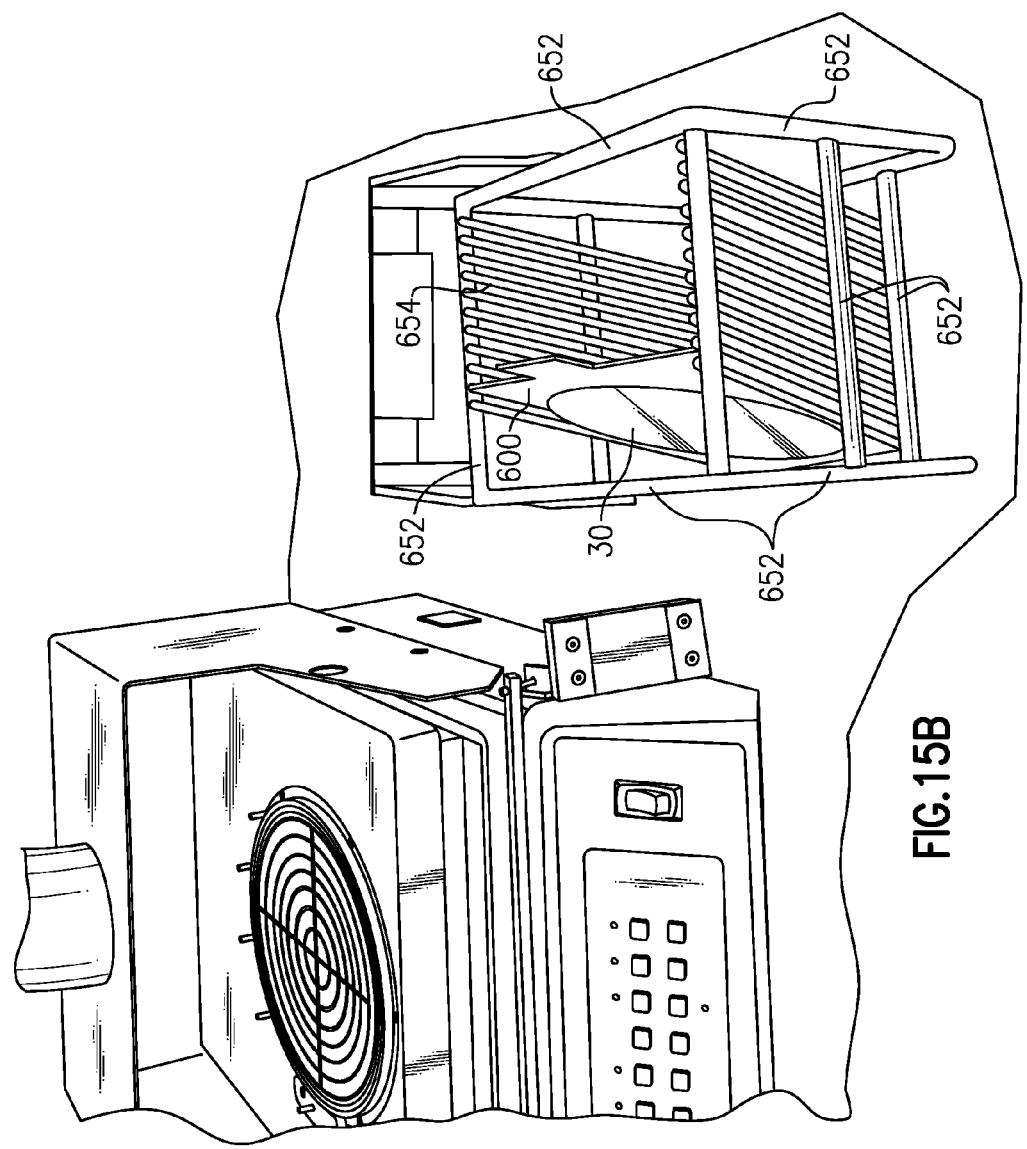
FIG. 15B shows the cassette device of FIG. 15A in its second orientation that facilitates cleaning and drying of the wafers.
Figure 16:
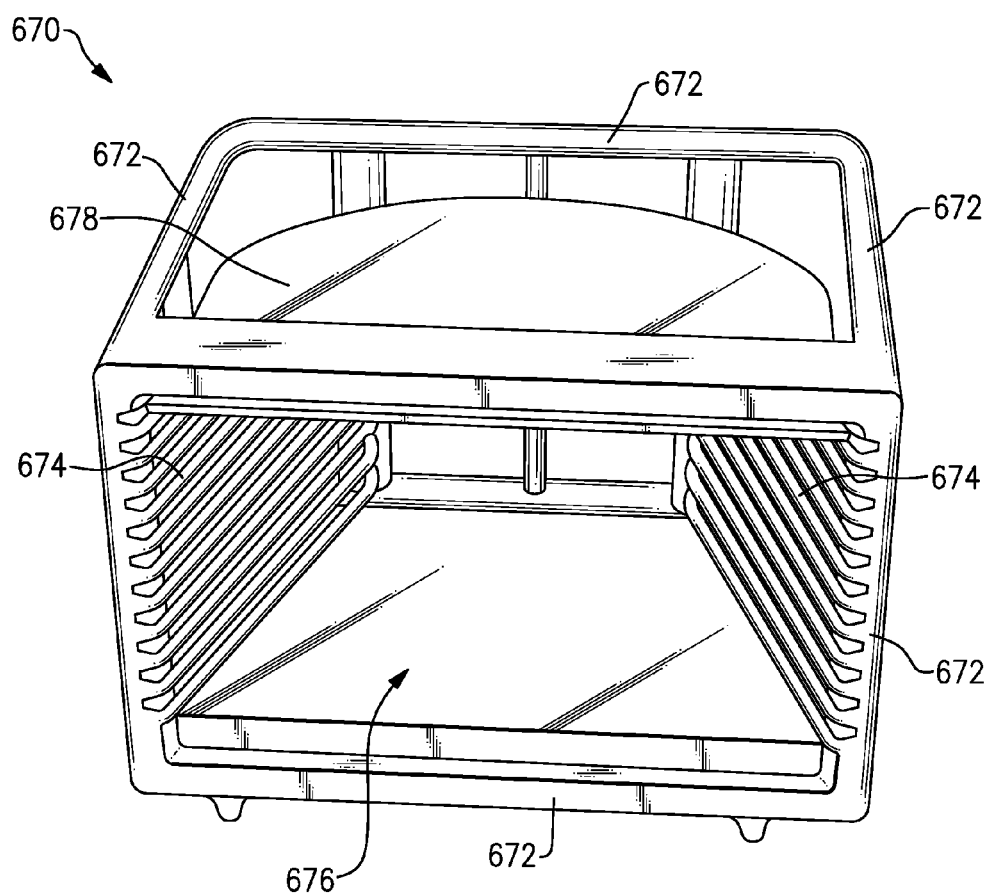
FIG. 16 shows that in certain implementations, a second cassette device can be configured to hold a number of the wafer holders of FIGS. 14A and 14B so as to facilitate operations such as a plasma ash process to remove residues from the cleaned wafers.

In certain implementations, one or more features associated with the various embodiments of the debonding chuck described in reference to FIGS. 8-12 can be implemented in a number of debonding systems. FIGS. 13A and 13B show various components of an example of a manual debonding system. FIGS. 14-16 show various devices that can facilitate efficient handling of wafers from the manual system and cleaning of such wafers. FIGS. 17-20 show various components of an example automated debonding system.

Referring to FIGS. 13A and 13B, a debonding apparatus 500 includes a debonding chuck 502 mounted on a hotplate 504. The chuck 502 can include one or more features as described in reference to FIGS. 8-12. The particular example chuck shown in FIG. 13A includes an angled surface feature 512 described in reference to FIGS. 12A and 12B.

The debonding apparatus 500 can also include a vacuum system (e.g., vacuum pathway 506) configured to provide the suction for separating wafers from carrier plates. The apparatus 500 is shown to include a vacuum control switch 510 for turning the vacuum system on and off, and a heating control 508 that can set the hotplate temperature.

In the example shown, loading of the wafer-carrier assembly and removal of the separated carrier plate and wafer can be performed manually by an operator. Turning on and off of the vacuum can also be performed manually.

Also shown in the example, the hotplate can remain heated at a desired temperature (e.g., approximately 130° C. to 170° C.). To facilitate a higher throughput, wafer-carrier assemblies to be debonded can be preheated by a separate heater 530. In FIG. 13A, a wafer-carrier assembly 520 is shown as being preheated by the heater 530. In FIG. 13B, the preheated assembly 520 is shown as having been transferred from the heater 530 to the debonding chuck 502 of the apparatus 500, and ready to be debonded.

An example sequence of operations for preheating and debonding can be performed as follows. A wafer-carrier assembly 520 to be preheated can be positioned on the heater 530 with the wafer underneath the carrier plate. Once preheated, the assembly 520 can be transferred to the debonding chuck 502 of the apparatus 500 in the same orientation.

Once on the chuck 502, the wafer can be separated from the carrier plate. The separated carrier plate can be removed first since it is on the top; and the wafer in the recess of the chuck 502 has its adhesive side facing up. The wafer can be removed from the chuck 502 and positioned on a wafer holder while in the same orientation for cleaning. Thus, one can readily see that the top-loading capability of the chuck and the chuck not requiring any additional devices on its top for the separation process allows the manual sequence of operations to be performed easily, relatively fast, and with lowered risk of damage to the wafer. As described herein, such features of the debonding chuck allow the debonding operation steps to be automated.

Figure 14A:
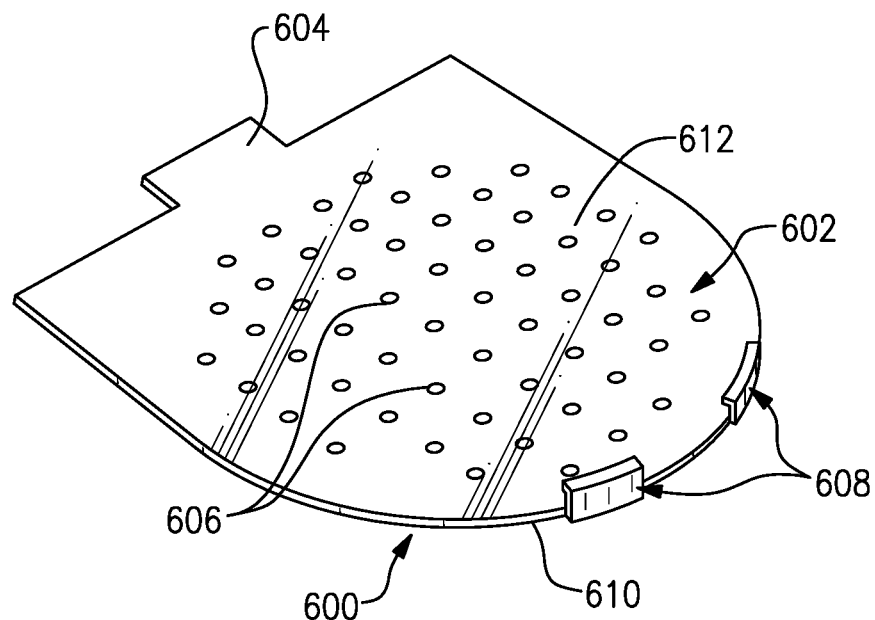
FIGS. 14A and 14B show that in certain implementations, a wafer holder can be provided for holding a separated wafer (e.g., from the manual debonding system of FIGS. 13A and 13B) to facilitate one or more post-separation operations such as cleaning.
Figure 14B:
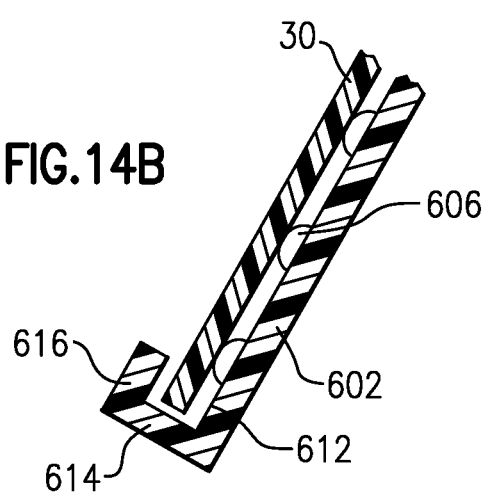
Figure 14C:
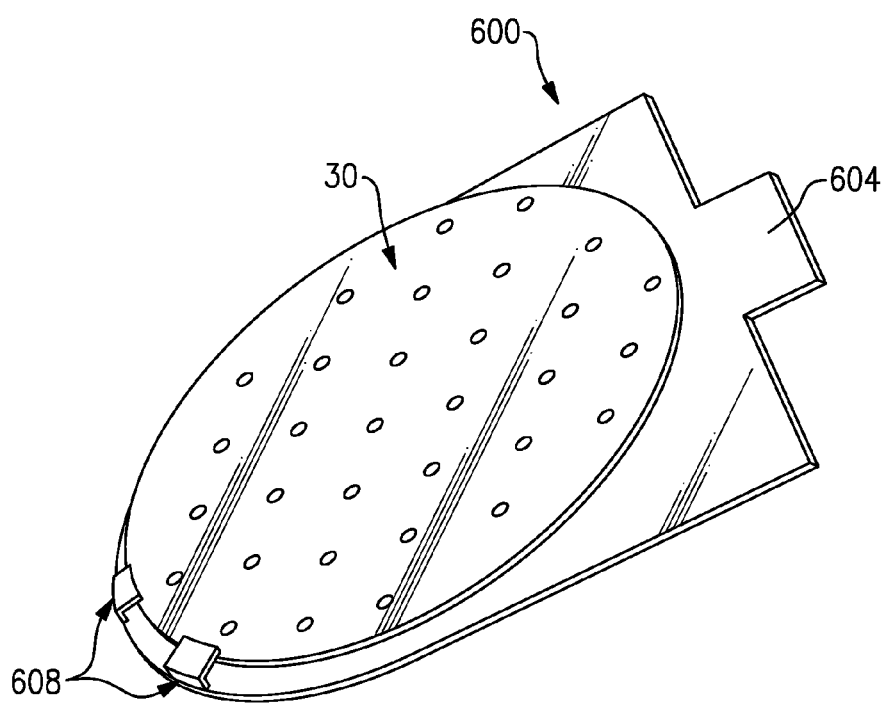
FIG. 14C shows the wafer holder of FIG. 14A holding a wafer.

FIGS. 14A-14C show various views of a wafer holder 600 configured to allow the separated wafer (30) from the debonding apparatus 500 to be collected for handling during post-separation processes such as cleaning. FIGS. 15A and 15B show a cassette 650 configured to receive a plurality of wafer holders (600) with wafers thereon. The cassette 650 can be in a first orientation (FIG. 15A) in which the cassette 650 is configured to receive the wafer holders 600 with debonded wafers. The cassette 650 can also be in a second orientation (FIG. 15B) in which the cassette 650 is configured to hold the wafer holders 600 (and hence the wafers) at a desired angle relative to the vertical direction to facilitate efficient cleaning and drying of the wafers.

Referring to FIGS. 14A-14C, the wafer holder 600 can include a plate 602 having a first surface 612. The plate 602 can be dimensioned to accommodate a debonded wafer 30, and can include a handling tab 604. In the example shown, the tab end of the plate 602 has a generally straight edge and square corners; while the end 610 opposite from the tab 604 is curved to generally conform to the wafer's circular shape. FIG. 14C shows a wafer 30 held by the holder 600. As described in the example sequence of manual debonding operations, a debonded wafer can have its adhesive side on top. Thus, the upper side of the wafer 30 shown in FIG. 14C is the adhesive side.

Referring to FIG. 15A, the wafer holder 600 with the wafer 30 held therein is shown to be inserted into one of the plurality of receiving slots in the cassette 650 (in its first orientation). In such a configuration, the adhesive side (to be cleaned) of the wafer 30 remains on the top, thereby facilitating an efficient transfer of wafers between the various operations.

Referring to FIGS. 14A-14C, the wafer holder 600 can further include a "J" shaped (plate 602, a second extension 614 from the plate 602, and a second extension 616 from the first extension 614) retaining feature 608 formed at or near the curved end 610 opposite from the tab end. The retaining feature 608 thus defines a recess dimensioned to receive an edge of the wafer 30.

In the example shown there are two retaining features 608 separated by a plain edge (of the plate 602) in between and generally centered at the curved end 610. Such a separation of the retaining features 608 allows liquid such as cleaning fluid to drain from the retaining features 608 when the curved end is downward of the tab end (e.g., FIG. 15B).

Referring to FIGS. 14A-14C, the wafer holder 600 can further include a number of bumps 606 formed on the first surface 612 of the plate 602. In FIG. 14B, the bumps 606 are shown to engage the unbonded side of the wafer 30, so as to separate the wafer from the first surface 612 of the plate 602. Such a separation inhibits the wafer surface from sticking to the first surface (e.g., due to surface tension of fluid therebetween), and to promote drainage of fluid. The retaining feature 608 can be dimensioned to accommodate the wafer offset provided by the bumps 606. The bumps 606 can be configured to have smooth surfaces so as to reduce the likelihood of damage to the wafer 30.

In certain embodiments, the wafer holder 600 can be formed from relatively rigid and chemical resistant materials such as quartz and glass. In certain embodiments, the wafer holder 600 can be formed from one of the foregoing materials by a process such as molding.

Referring to FIGS. 15A and 15B, the cassette 650 is shown to have a generally rectangular box shaped structure formed by frame members 652. To allow flow of cleaning liquid to the wafers, the six faces of the box are generally open. The side (656) through which the wafer holders are loaded is substantially free of structures other than the box-defining frame members 652. From the sides of the loading side 656 extend a number of slot-defining bars 654 to the side opposite from the loading side 656. The slot-defining bars 654 are shown to be angled inward to facilitate more positive wafer-holder retaining slots.

As shown in FIG. 15B, when the cassette 650 is oriented so that the loading side 656 is facing upwards (such as during cleaning and draining), the slots formed by the bars 654 (and thus the wafers therein) are at an angle away from the vertical. Such an angle can be selected based on a number of operating parameters. For example, if the orientation of the wafer and its holder are closer to vertical, then fluid drainage improves; however, the wafer is less stable in its holder and full or close to full weight of the wafer can be concentrated on the bottom edge portion of the wafer. On the other hand, if the orientation of the wafer and its holder are more away from the vertical, then the fluid drainage can suffer; however, the wafer is more stable in its holder and the weight of the wafer is better distributed to the bumps 606 of the holder 600.

In certain embodiments, the angle of the slots on the cassette 650 can be selected to be approximately 20 degrees relative to the vertical. In certain embodiments, such an angle can be in a range of approximately 5 to 45 degrees from the vertical; approximately 10 to 30 degrees from the vertical; or approximately 15 to 25 degrees from the vertical.

In embodiments where the slots on the cassette 650 are angled in the foregoing manner, if the cassette 650 is positioned on a flat surface so that the loading side 656 faces the operator, the wafers can slide out due to the now-downward angle of the slots. Thus, a base unit 660 can be provided (FIG. 15A), where the base 660 includes an angled cassette-holding surface. In certain embodiments, the angled surface of the base 660 can be selected to counter the downward angle of the slots, such that the wafers in the slots can be generally horizontal during collection from the debonding apparatus.

In certain embodiments, the cassette 650 can be formed from relatively rigid and chemical resistant materials such as quartz and glass.

In certain implementations, a cassette (650) that has been filled with wafers (on their holders) can be dipped into one or more solvent tanks to clean the wafers (e.g., by acetone) in known manners. Once cleaned, the cassette (650) can be removed from the solvent tanks and be placed in an oven to dry the wafers. During such cleaning and drying, the cassette (650) can be in the orientation shown in FIG. 15B so as to orient the wafers at an angle.

In certain implementations, such solvent-cleaned and dried wafers can be ash plasma cleaned to remove residues that may remain. FIG. 16 shows a cassette 670 that is similar to the cleaning cassette 650 of FIG. 15.

More particularly, the cassette 670 is shown to have a generally rectangular box shaped structure formed by frame members 672. To allow ash plasma cleaning of the wafers in a generally uniform manner, the four sides (including the loading side 676) are generally open so as to provide similar exposure for the spaced layers of wafers. Unlike the cleaning cassette 650, the top portion of the ashing cassette 670 includes a cover 678 that is shaped similar to a wafer holder (600 in FIG. 14). Thus, the top wafer positioned in the cassette 670 also has a wafer holder-like cover above, like the rest of the wafers. Unlike the cleaning cassette 650, the ashing cassette 670 generally remains in one orientation; thus, the slots (defined by the slot-defining bars 674) for holding the wafer-holders do not need to be angled. In certain embodiments, such slots are configured so that the wafers are held generally horizontally during the ash plasma cleaning process.

Referring to FIG. 17, an automated debonding system 700 can include a number of stations that can perform similar debonding and cleaning operations associated with the manual debonding apparatus 500 of FIG. 13. The automated system 700 is shown to include a debonding station 710, a cooling station 720, and a cleaning station 730. The system 700 is also shown to include a robotic component 740 that controls the movements and manipulating operations of one or more robotic arms (e.g., 742, 744). Operations of robotic component 740 to manipulate and move wafer-carrier assemblies, carrier plates, and wafers can be achieved in a number of known manners.

Referring to FIGS. 18A and 18B, the debonding station 710 includes a debonding chuck 800 having one or more features as described herein. The debonding chuck 800 is shown to be mounted on a platform 802.

In the example automated system 700, the debonding station 710 can include a heating component (not shown) so as to allow heating of a wafer-carrier assembly 804 via the chuck 800. The debonding station 710 can also include or be in communication with a vacuum system (not shown) so as to facilitate the separation of the wafer-carrier assembly 804 via the chuck 800.

To position the wafer-carrier assembly 804 on the debonding chuck 800, the assembly 804 is positioned (via the robotic component 740) on the receiving portions of a number of lifting pins 810 that are positioned circumferentially outside the chuck's recess. The receiving portions of the lifting pins 810 can be at similar radial location as that of the upper surface of the recess, so that when the pins are lowered, their receiving portions are at the same or lower level than the upper surface where the carrier plate rests. As shown in FIG. 18B, the upward extending members positioned radially outward of the receiving portions of the lifting pins 810 generally constrains the lateral position of the carrier plate over the upper surface of the recess.

Referring to FIG. 18B, the wafer-carrier plate 804 positioned on the pins 810 can be lowered to the chuck 800; and heating and separation of the wafer can occur. Once the wafer is separated from the carrier plate, the separated carrier plate can be lifted back up by the lifting pins 810. Then, the carrier plate can be moved away from the debonding station 710 via the robotic component 740; and the lifting pins 810 can be lowered back into the platform 802.

In certain embodiments, the lowering and/or lifting of each of the lifting pins 810 can be controlled independently. Such a capability can reduce the likelihood that the wafer will also be lifted when the carrier plate is lifted. Such a likelihood can be greater when all of the pins rise at substantially the same time. By raising one pin first, the carrier plate can be further separated or peeled away from the wafer so as to keep the wafer held to the vacuum surface of the chuck 800.

Once the carrier plate has been removed and the lifting pins 810 retracted, the separated wafer can be removed from the recess of the debonding chuck. In the example shown, the wafer can be lifted out of the recess by an upward suction applied by a suction lifting member 760. Note that the lifting member 760 positioned over the chuck 800 for the purpose of lifting the wafer; and remains away from the chuck during other operations.

Once the wafer is lifted above the chuck 800, the wafer can be transferred to a robotic arm (e.g., 744) that in turn positions the wafer on the cooling station 720. Once the wafer has cooled sufficiently, the wafer is transferred (via the robotic component 740) to the cleaning station 730 to remove the adhesive.

Referring to FIG. 19, the cleaning station 730 can be configured to provide both cleaning and drying functionalities. The cleaning can be achieved by cleaning solvent (e.g., acetone) sprayed through a spray head 824 on a swivel arm. The swivel arm allows the solvent spray to sweep across the wafer.

In the example shown, a chuck 822 is provided for holding the wafer during the foregoing cleaning process, and for spinning and drying the wafer. To provide a strong hold of the wafer during such spinning, the chuck 822 can be configured to be relatively large and to hold the wafer by vacuum.

In the example shown, the chuck 822 is in a raised position to receive a wafer. Once the wafer is secured thereon, the chuck 822 can be lowered into a space surrounded by a housing 820. The housing 820 can be dimensioned to capture fluids during the cleaning process, and to contain fluids being spun away from the wafer during the drying process.

Spray cleaning in the foregoing manner in the automated system 700 has shown to clean the wafers better than the solvent dipping method used after the manual debonding process. In the through-wafer via process on GaAs wafers, the spray cleaning can result in an increase in the overall yield.

Figure 20:
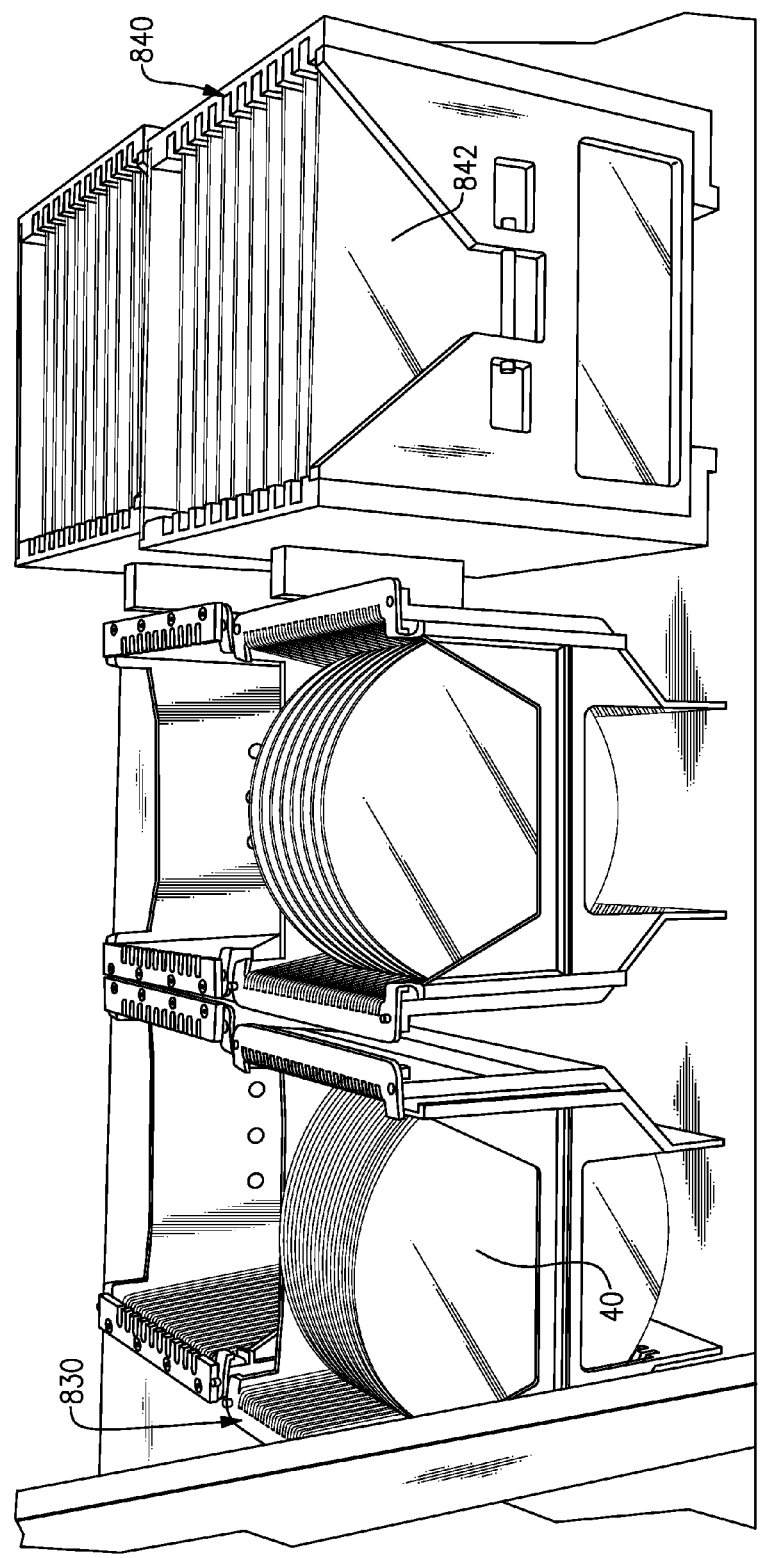
FIG. 20 shows that in certain implementations, one or more collection devices can be provided to collect separated wafers and carriers from the automated system of FIG. 17.

FIG. 20 shows an example of how the separated carrier plates and the cleaned wafers can be collected in the automated debonding system 700. A carrier plate-holding receptacle 830 is depicted as holding a plurality of carrier plates 40 that have been separated from their respective wafers. Once filled, the receptacle 830 can be removed from the system 700 for recycling of the carrier plates 40.

FIG. 20 also shows a wafer receptacle 840. The receptacle 840 can be configured to hold a plurality of support plates 842 such as those commercially available Gel-Pak plates. Each support plate 842 holds one cleaned wafer; and once the receptacle 840 is filled, the receptacle can be removed from the system 700.

In certain implementations, the wafers removed from the automated system 700 can be cleaned further via the ash plasma cleaning process. For such a cleaning process, the wafers can be transferred from the Gel-Pak support plates 842 onto the wafer holders (600) described in reference to FIG. 14. Such holders with wafers thereon can be loaded onto the cassette 670 of FIG. 16 for the ash plasma cleaning process.

In various implementations, the wafers debonded and cleaned in various manners described herein can be collected for further processing such as testing and singulation.

Referring to FIGS. 18A and 18B where the example lifting pins 810 are depicted, it is noted that in certain implementations, a debonding apparatus having such a set of lifting pins can include a chuck with a vacuum surface that may or may not be recessed. If the vacuum surface is recessed, the depth of such a recess may or may not by greater than the thickness of a wafer placed therein.

Thus, even if there is no recess or the thickness of the wafer is greater than the depth of the recess, the wafer can be vacuum held by the vacuum surface and a relatively rigid carrier plate can be moved or peeled away from the substantially stationary wafer by appropriate raising of lifting members (e.g., lifting pins). For example, by raising one lifting member first, the carrier plate can be separated or peeled away from the wafer while the wafer is held to the vacuum surface.

In certain embodiments, one or more of the foregoing features can be implemented in a debonding apparatus (manual or automated) that can be configured to separate a wafer from a plate. In certain embodiments, the plate can have a lateral dimension that is larger than a lateral dimension of the wafer, such that an assembly of the wafer and the plate includes a peripheral area on the plate that is not covered by the wafer. In certain embodiments, the wafer and the plate can be dimensioned similarly so that there is little or no peripheral area.

Such a debonding apparatus can include a chuck having a vacuum surface configured to receive the wafer of the assembly. The apparatus can further include one or more separation members disposed relative to the vacuum surface so as to allow the one or more separation members to engage at least a portion of the plate and move that portion of the plate without directly touching the wafer. Such a forced motion of the plate (induced by the one or more separation members) allows the plate to separate from the wafer when the wafer is held on the vacuum surface by application of vacuum.

In certain embodiments, the one or more separation members can include one or more lift members. In certain embodiments, such lift members can include a plurality of lift pins (e.g., lift pins 810 of FIG. 18B) dimensioned and disposed so as to engage the peripheral area on the plate but not the wafer. Such lift pins can be configured so that at least one is capable of moving independently from other lift pin(s).

In certain embodiments, the one or more lift members can include a blade (e.g., a spatula shaped device) dimensioned and disposed so as to engage the peripheral area on the plate but not the wafer. Such a blade can engage the peripheral area on the plate and lift the plate away from the wafer.

In certain embodiments, the one or more separation members can include a suction member disposed on the side of the plate that is opposite from the side engaging the wafer. In such an example, the plate may or may not be oversized relative to the wafer. The suction member can be disposed away from the plate's center so as to allow one side of the plate to be separated first from the wafer.

In certain embodiments, the vacuum surface can be defined by a floor surface of a recess having a lateral dimension that is larger than the lateral dimension of the wafer, but less than the lateral dimension of the plate. In certain embodiments, the recess can have a depth that is selected to be greater than the wafer's thickness such that upon application of the vacuum, the wafer can be pulled away from the plate by the suction force and allowed to become separated from the plate and engage the vacuum surface of the recess.

In certain implementations, a debonding apparatus having one or more of the foregoing features can be implemented in an automated debonding system or a manual debonding system.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A debonding chuck comprising:
a first surface that defines a recess configured to hold a wafer of an assembly that includes the wafer bonded to a plate having a first diameter that is larger than a second diameter of the wafer, the assembly configured such that the plate includes a peripheral area not covered by the wafer, and such that when the wafer of the assembly is placed within the recess, at least a portion of the peripheral area of the plate engages at least a portion of the first surface;
a second surface disposed in the recess and separated from the first surface, the second surface including a plurality of suction openings configured to deliver suction to the recess and an angled surface formed along a portion of a perimeter of the second surface; and
a third surface substantially connecting the first and the second surfaces.

2. The debonding chuck of claim 1 wherein the angled surface is configured to provide at least some pressure communication between the recess and outside the recess during delivery of the suction to the recess.

3. The debonding chuck of claim 1 wherein the second surface engages the wafer and the first surface engages the plate when the wafer is debonded from the plate by the suction.

4. The debonding chuck of claim 1 wherein the second surface further includes one or more grooves that are configured to distribute the suction.

5. The debonding chuck of claim 4 wherein the one or more grooves includes a plurality of grooves shaped in concentric circles about a center of the second surface.

6. The debonding chuck of claim 4 wherein the angled surface cuts through a portion of the one or more grooves.

7. The debonding chuck of claim 4 wherein the one or more suction openings are in pressure communication with the one or more grooves.

8. The debonding chuck of claim 4 wherein the one or more suction openings are formed within the one or more grooves.

9. The debonding chuck of claim 1 wherein the angled surface cuts through a portion of the third surface.

10. The debonding chuck of claim 1 wherein the third surface includes at least one opening dimensioned to limit a pressure differential between the recess and outside the recess during delivery of the suction to the recess.

11. A debonding system comprising:
a debonding chuck including a first surface that defines a recess configured to hold a wafer of an assembly that includes the wafer bonded to a plate having a first diameter that is larger than a second diameter of the wafer, the assembly configured such that the plate includes a peripheral area not covered by the wafer, and such that when the wafer of the assembly is placed within the recess, at least a portion of the peripheral area of the plate engages at least a portion of the first surface, a second surface disposed in the recess and separated from the first surface, the second surface including a plurality of suction openings configured to deliver suction to the recess and an angled surface formed along a portion of a perimeter of the second surface, and a third surface substantially connecting the first and the second surfaces; and a pressure sensor configured to monitor a pressure associated with the suction during the delivery of the suction to the recess.

12. The debonding system of claim 11 wherein angled surface is configured to provide at least some pressure communication between the recess and outside the recess during delivery of the suction to the recess.

13. The debonding system of claim 11 wherein the second surface engages the wafer and the first surface engages the plate when the wafer is debonded from the plate by the suction.

14. The debonding system of claim 11 wherein the second surface further includes one or more grooves that are configured to distribute the suction.

15. The debonding system of claim 14 wherein the one or more grooves includes a plurality of grooves shaped in concentric circles about a center of the second surface.

16. The debonding system of claim 14 wherein the angled surface cuts through a portion of the one or more grooves.

17. The debonding system of claim 14 wherein the one or more suction openings are in pressure communication with the one or more grooves.

18. The debonding system of claim 14 wherein the one or more suction openings are formed within the one or more grooves.

19. The debonding system of claim 11 wherein the angled surface cuts through a portion of the third surface.

20. The debonding system of claim 11 wherein the third surface includes at least one opening dimensioned to limit a pressure differential between the recess and outside the recess during delivery of the suction to the recess.

* * * * *